(12) United States Patent
Ueda

(10) Patent No.: US 7,435,995 B2
(45) Date of Patent: Oct. 14, 2008

(54) PHOSPHOR, SEMICONDUCTOR LIGHT EMITTING DEVICE, AND FABRICATION METHOD THEREOF

(75) Inventor: Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/593,547

(22) Filed: Nov. 7, 2006

(65) Prior Publication Data

US 2007/0057269 A1    Mar. 15, 2007

Related U.S. Application Data

(63) Continuation of application No. 10/860,394, filed on Jun. 4, 2004, now Pat. No. 7,268,370.

(30) Foreign Application Priority Data

Jun. 5, 2003    (JP) .............................. 2003-160272

(51) Int. Cl.
H01L 33/00    (2006.01)
(52) U.S. Cl. .......................................... 257/84; 257/99
(58) Field of Classification Search .................. 257/84, 257/99
See application file for complete search history.

(56) References Cited

U.S. PATENT DOCUMENTS

| | | | |
|---|---|---|---|
| 5,289,081 A | 2/1994 | Tamatani et al. | |
| 6,310,364 B1 | 10/2001 | Uemura | |
| 6,600,175 B1 | 7/2003 | Baretz et al. | |
| 2002/0003233 A1 | 1/2002 | Mueller-Mach et al. | |
| 2002/0030197 A1 | 3/2002 | Sugawara et al. | |
| 2003/0155856 A1 | 8/2003 | Shiiki et al. | |
| 2004/0041220 A1 | 3/2004 | Kwak et al. | |
| 2004/0106222 A1 | 6/2004 | Steckl et al. | |
| 2005/0184298 A1 | 8/2005 | Ueda | |
| 2005/0184305 A1 | 8/2005 | Ueda | |

FOREIGN PATENT DOCUMENTS

| | | |
|---|---|---|
| JP | 09036430 A * | 2/1997 |
| JP | 9-232627 | 9/1997 |
| JP | 2000-183408 | 6/2000 |
| JP | 2000-261034 | 9/2000 |
| JP | 2001-007401 | 1/2001 |
| JP | 2001-257379 | 9/2001 |
| JP | 2001-352098 | 12/2001 |
| JP | 2002-257376 | 2/2002 |

(Continued)

OTHER PUBLICATIONS

Studenikin et al., "Fabrication of green and orange photoluminescent, undoped ZnO films using spray pyrolysis," Journal of Applied Physics vol. 84, No. 4 (Aug. 15, 1998) pp. 2287-2296.*

(Continued)

Primary Examiner—Thomas L Dickey
(74) Attorney, Agent, or Firm—Greenblum & Bernstein, P.L.C.

(57) ABSTRACT

A phosphor that emits white light due to excitation by a light emitting diode capable of emitting blue or ultraviolet light includes: a substrate that allows transmission of visible light; and a semiconductor layer formed on the substrate.

3 Claims, 14 Drawing Sheets

FOREIGN PATENT DOCUMENTS

| | | |
|---|---|---|
| JP | 2002-042525 | 8/2002 |
| JP | 2002-246651 | 8/2002 |
| JP | 2002-368265 | 12/2002 |
| JP | 2003-060223 | 2/2003 |
| JP | 2003-152222 | 5/2003 |
| JP | 2004-228464 | 8/2004 |

OTHER PUBLICATIONS

Shuji Nakamura and Gerhard Fasol, "The Blue Laser Diode," Springer-Verlag, Berlin, Heidelberg, New York, p. 216.
English language Abstract of JP 2000-261034, published Sep. 22, 2000.
English language Abstract of JP 9-232627, published Sep. 5, 1997.
English language Abstract of JP 2002-246651, published Aug. 30, 2002.
English language Abstract of JP 2001-257379, published Sep. 21, 2001.
English language Abstract of JP 2003-060223, published Feb. 28, 2003.
English language Abstract of JP 2002-057376.
English language Abstract of JP 2000-183408.
English language Abstract of JP 2004-228464.
English language Abstract of JP 2001-007401.
English language Abstract of JP 2001-352098.
English language Abstract of JP 2002-368265.
English language Abstract of JP 2003-152222.
English language Abstract of JP 2002-042525.

* cited by examiner

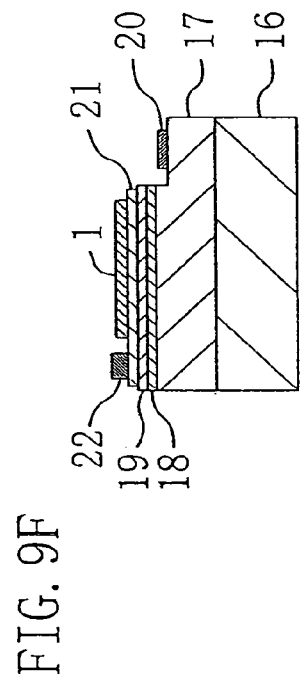
FIG. 9E
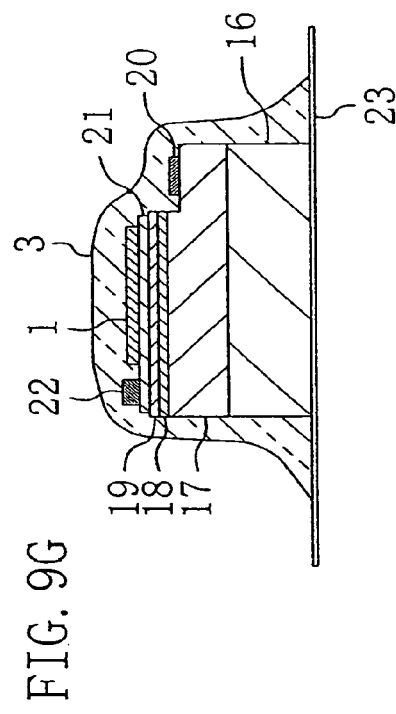
FIG. 9F
FIG. 9G
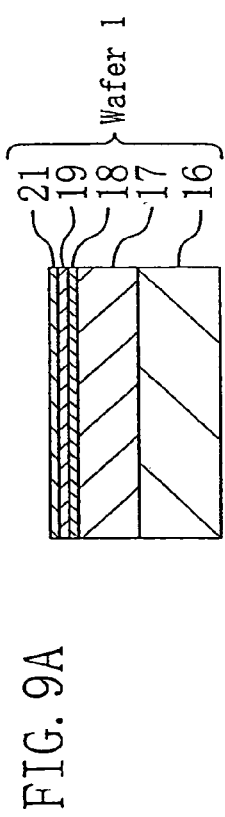
FIG. 9A
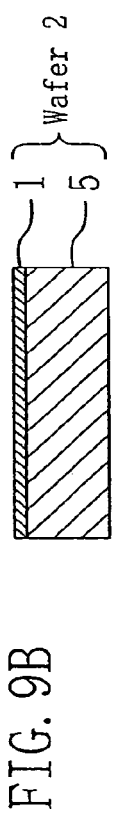
FIG. 9B
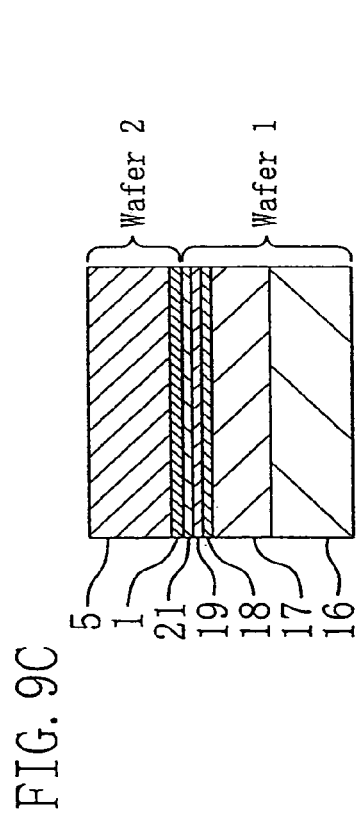
FIG. 9C
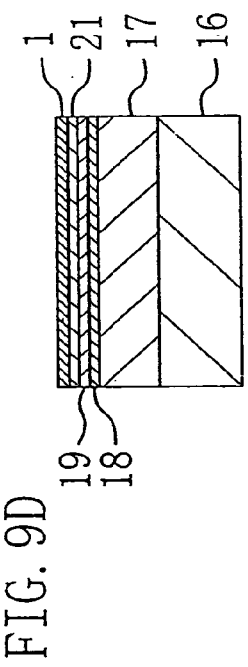
FIG. 9D

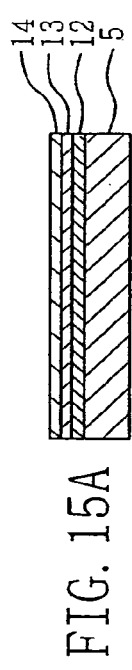
FIG. 15A
FIG. 15B
FIG. 15C
FIG. 15D
FIG. 15E
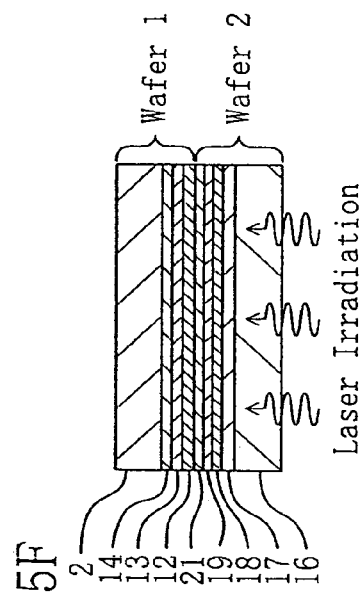
FIG. 15F
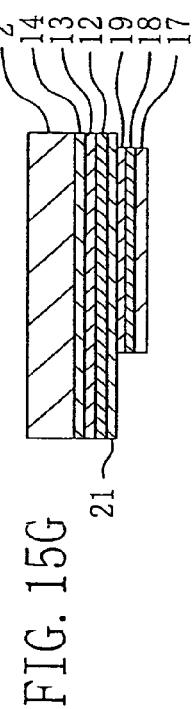
FIG. 15G
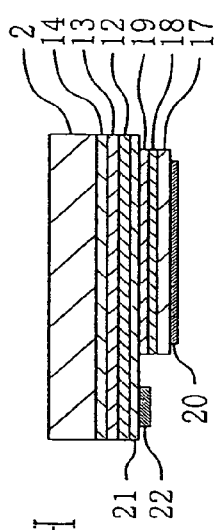
FIG. 15H
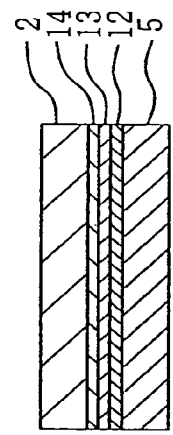
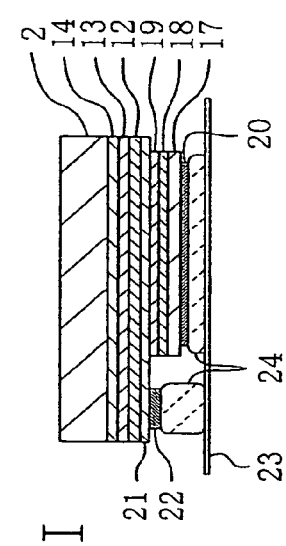
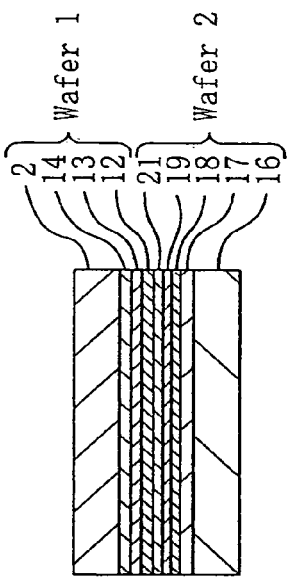
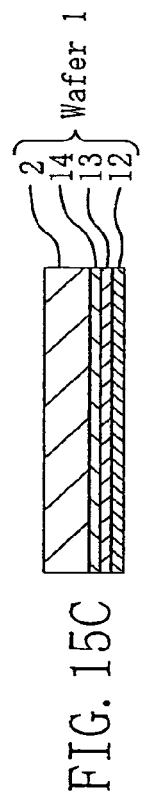
FIG. 15I

PHOSPHOR, SEMICONDUCTOR LIGHT EMITTING DEVICE, AND FABRICATION METHOD THEREOF

CROSS-REFERENCE TO RELATED APPLICATIONS

This application is a Continuation of application Ser. No. 10/860,394, filed Jun. 4, 2004, now U.S. Pat. No. 7,268,370 the entire disclosure of which is expressly incorporated by reference herein in its entirety.

This application claims priority under 35 U.S.C. §119(a) on Japanese Patent Application No. 2003-160272 filed on Jun. 5, 2003, the entire contents of which are hereby incorporated by reference.

BACKGROUND OF THE INVENTION

The present invention relates to phosphors applicable to, for example, white-light-emitting diodes, semiconductor light emitting devices on which the phosphors are integrated, and fabrication methods thereof.

GaN-based Group III-V nitride semiconductor (InGaAlN) has a wide band gap (for example, GaN has a band gap of 3.4 eV at room temperature), and thus serves as a material that can realize a high-power light emitting diode in the wavelengths ranging from green and blue to ultraviolet. Blue and green-light-emitting diodes have already been in practical use in various displays, large-screen displays or signals. Furthermore, a white-light-emitting diode that can emit white light by exciting a YAG phosphor using a blue-light-emitting diode is being actively researched and developed to achieve higher brightness and an improvement in luminous efficiency, aiming at the implementation of semiconductor lighting which replaces current fluorescent lamps, incandescent electric lamps or the like. In particular, a white-light-emitting diode for lighting is expected to create a big market. In lighting application, in addition to improvements in brightness and luminous efficiency, it is important to improve the way a color is viewed, i.e., color rendering properties, when the diode is used for lighting.

Until now, a white-light-emitting diode, which emits white light by exciting a YAG phosphor using light with a wavelength of about 470 nm emitted from a GaN-based blue-light-emitting diode to obtain yellow light emission, has been developed and commercialized.

However, in such a white-light-emitting diode, the component of red light emission in emission spectrum is small, and therefore, the white-light-emitting diode causes a problem since it has poorer color rendering properties compared with a conventional fluorescent lamp or incandescent electric lamp. In this case, if excitation light can have a wavelength as short as that of ultraviolet light, a phosphor material used in a typical fluorescent lamp or the like can be utilized. However, in order to shorten the emission wavelength of a GaN-based light emitting diode, it is necessary to use AlGaN with a high Al composition which has difficulty in providing crystal growth. In addition, since the brightness or lifetime largely depends on the density of crystal defects, it is generally difficult to realize a GaN-based light emitting diode that can emit light with a wavelength as short as that of ultraviolet light. Besides, an ultraviolet-light-emitting diode, which can emit light with a wavelength of 350 nm or less, reportedly has an emission output of only about a few mW, and therefore, such a diode needs to be further improved in the future.

Under the circumstances, in order to improve the color rendering properties in white light emission, it is necessary to increase the brightness of a phosphor material that emits red light, in particular; furthermore, in consideration of the situation in which it is difficult to shorten the wavelength of light, there is a demand for a phosphor material that can realize strong red light emission by excitation light with a longer wavelength.

Hereinafter, with reference to FIG. 16, description will be made about a conventional white-light-emitting diode that realizes white light emission by exciting a YAG phosphor using a GaN-based blue-light-emitting diode as already mentioned above.

FIG. 16 is a cross-sectional view illustrating the structure of a conventional white-light-emitting diode that uses GaN-based semiconductor.

As shown in FIG. 16, an n-type InGaAlN layer 101, an active layer 102 made of InGaAlN, and a p-type InGaAlN layer 103 are formed in this order from below over a sapphire substrate 100 by an MOCVD process, for example. In this structure, the active layer 102 emits blue light having a wavelength of 470 nm when electric current is applied. On a surface of the n-type InGaAlN layer 101 from which a portion thereof is etched away for electrode formation (using a $Cl_2$ gas, for example), an electrode 105 made of Ti/Au is formed, and a transparent electrode 104 made of Ni/Au is formed on the p-type InGaAlN layer 103 that has been subjected to the etching. On the transparent electrode 104, an electrode 106 made of Au for bonding pad formation on the side of the n-type InGaAlN layer 103 is selectively formed. Thus, with the use of the transparent electrode 104, most of blue light emitted from the active layer 102 is transmitted through the transparent electrode 104 and taken out outside. It should be noted that in order to allow the transparent electrode 104 to serve as a transparent electrode, its thickness has to be 10 nm or less.

After a wafer functioning as a blue-light-emitting diode having the above-described structure has been divided into light emitting diode chips each having a size of, for example, 300 µm×300 µm, each chip is mounted on a package surface 107, and wire bonding is carried out. Thereafter, a material of a YAG phosphor 108 is dropped over a package and is hardened. Thus, the white-light-emitting diode having the structure shown in FIG. 16 is realized (see, for example, Japanese Unexamined Patent Publication No. 2002-246651). It should be noted that as the other white-light-emitting diode, a conventional example disclosed in, for example, Japanese Unexamined Patent Publication No. 2001-257379 is known.

Meanwhile, the above-described conventional white-light-emitting diode exhibits a luminous characteristic shown in FIG. 17. Specifically, as shown in FIG. 17, the conventional white-light-emitting diode realizes white light emission by mixing blue light emitted from a blue-light-emitting diode and yellow light emitted from a YAG phosphor. However, as apparent from FIG. 17, since the component of red light emission in emission spectrum of the white-light-emitting diode is small, it presents a problem that only white light emission poor in color rendering properties is obtained.

SUMMARY OF THE INVENTION

In view of the above, an object of the present invention is to provide a phosphor and a semiconductor light emitting device which can emit white light with excellent color rendering properties, and methods for fabricating the phosphor and the device.

In order to achieve the above object, a phosphor according to the present invention emits white light due to excitation by a light emitting diode capable of emitting blue or ultraviolet light, and is characterized by including: a substrate that allows transmission of visible light; and a semiconductor layer formed on the substrate.

In the phosphor according to the present invention, bright red light can be emitted from the semiconductor layer due to blue or ultraviolet light from the light emitting diode; thus, it becomes possible to realize a white-light-emitting diode structure having excellent color rendering properties.

In the phosphor according to the present invention, it is preferable that the phosphor further includes a phosphor layer made of a phosphor material formed on a surface of the substrate opposite to a surface thereof on which the semiconductor layer is formed, or on a surface of the semiconductor layer opposite to a surface thereof on which the substrate is formed.

In such an embodiment, by combining the phosphor layer, bright red light can be emitted from the semiconductor layer and yellow light can be emitted from the phosphor layer if blue light is emitted from the light emitting diode, for example, and thus it becomes possible to realize the white-light-emitting diode structure having excellent color rendering properties. Further, if ultraviolet light is emitted from the light emitting diode, for example, bright red light can be emitted from the semiconductor layer and green light can be emitted from the phosphor layer, and therefore, it becomes possible to realize the white-light-emitting diode structure having excellent color rendering properties.

In the phosphor according to the present invention, it is preferable that: the phosphor layer includes at least a first phosphor layer and a second phosphor layer; and the first phosphor layer and the second phosphor layer emit lights having different center wavelengths due to excitation by the light emitting diode.

In such an embodiment, bright red light can be emitted from the semiconductor layer, and green light and blue light can be emitted from the first phosphor layer and the second phosphor layer, respectively; thus, if ultraviolet light is emitted from the light emitting diode, it becomes possible to realize the white-light-emitting diode structure having excellent color rendering properties.

In the phosphor according to the present invention, it is preferable that: the first phosphor layer is formed by $Zn_2SiO_4$ to which Mn is added, $BaAl_{12}O_{19}$ to which Mn is added, $CeMgAl_{14}$ to which Tb is added, $BaMgAl_{10}O_{17}$ to which $Eu^{2+}$ and $Mn^{2+}$ are added, or $Y_2SiO_5$ to which $Ce^{3+}$ and $Tb^{3+}$ are added; and the second phosphor layer is formed by $BaMgAl_{14}O_{23}$ to which Eu is added, $YP_{0.85}V_{0.15}O_4$, $BaMg_2Al_{14}$ to which Eu is added, $(Sr, Ca)_{10}(PO_4)_6Cl_2$ to which $Eu^{2+}$ is added, or $BaMgAl_{10}O_{17}$ to which $Eu^{2+}$ is added.

In such an embodiment, green light is emitted from the first phosphor layer, and blue light is emitted from the second phosphor layer.

In the phosphor according to the present invention, it is preferable that the phosphor layer is formed by a single layer consisting of a YAG phosphor, or a plurality of layers including at least the YAG phosphor.

In such an embodiment, since brighter yellow light is emitted from the phosphor layer, bright red light can be emitted from the semiconductor layer if blue light is emitted from the light emitting diode, for example; thus, it becomes possible to realize the white-light-emitting diode structure having excellent color rendering properties.

In the phosphor according to the present invention, it is preferable that the semiconductor layer emits red light due to excitation by the light emitting diode.

In such an embodiment, white light emission with excellent color rendering properties can be realized.

In the phosphor according to the present invention, it is preferable that the semiconductor layer is made of InGaAlP.

In such an embodiment, brighter red light is emitted from the semiconductor layer due to blue or ultraviolet light from the light emitting diode.

In the phosphor according to the present invention, it is preferable that: the semiconductor layer includes at least a first semiconductor layer and a second semiconductor layer; the first semiconductor layer emits red light due to excitation by the light emitting diode; and the second semiconductor layer emits green light due to excitation by the light emitting diode.

In such an embodiment, since red light and green light from the diode that emits white light become strong, the white-light-emitting diode structure having excellent color rendering properties can be realized.

In the phosphor according to the present invention, it is preferable that: the first semiconductor layer is made of InGaAlP; and the second semiconductor layer is made of ZnMgSSe.

In such an embodiment, brighter red light is emitted from the first semiconductor layer, and brighter green light is emitted from the second semiconductor layer.

In the phosphor according to the present invention, it is preferable that the substrate that allows transmission of visible light is a quartz substrate, a glass substrate or a sapphire substrate.

A first semiconductor light emitting device according to the present invention emits white light, and is characterized by including: a light emitting diode chip capable of emitting blue or ultraviolet light; and a phosphor including: a substrate that allows transmission of visible light, the substrate being located at a position which enables transmission of light emitted from the light emitting diode chip; and a semiconductor layer formed on the substrate, wherein the light emitting diode chip and the phosphor are mounted in a single package.

In the first semiconductor light emitting device according to the present invention, bright red light can be emitted from the semiconductor layer due to blue or ultraviolet light from the light emitting diode chip; thus, it becomes possible to realize a white-light-emitting diode structure having excellent color rendering properties without using any special package.

In the first semiconductor light emitting device according to the present invention, it is preferable that: the phosphor further includes a phosphor layer made of a phosphor material formed on a surface of the substrate opposite to a surface thereof on which the semiconductor layer is formed, or on a surface of the semiconductor layer opposite to a surface thereof on which the substrate is formed.

In such an embodiment, by combining the phosphor layer, bright red light can be emitted from the semiconductor layer and yellow light can be emitted from the phosphor layer if blue light is emitted from the light emitting diode chip, for example, and thus it becomes possible to realize the white-light-emitting diode structure having excellent color rendering properties without using any special package. Furthermore, if ultraviolet light is emitted from the light emitting diode chip, for example, bright red light can be emitted from the semiconductor layer and green light can be emitted from the phosphor layer, and therefore, it becomes possible to realize the white-light-emitting diode structure having excellent color rendering properties without using any special package.

A second semiconductor light emitting device according to the present invention emits white light, and is characterized by including: a diode that is formed on a substrate, has an active layer made of InGaAlN, and is capable of emitting blue or ultraviolet light; a transparent electrode that is formed on the diode, and allows transmission of light emitted from the diode; a semiconductor layer formed on the transparent electrode; and a phosphor layer made of a phosphor material formed on the semiconductor layer.

In the second semiconductor light emitting device according to the present invention, bright red light can be emitted from the semiconductor layer, and yellow light can be emitted from the phosphor layer; therefore, if blue light is emitted from the light emitting diode, it becomes possible to realize a white-light-emitting diode structure having excellent color rendering properties without using any special package.

In the second semiconductor light emitting device according to the present invention, it is preferable that the transparent electrode is made of an ITO material.

In such an embodiment, since the transparent electrode has a high transmittance, luminous intensity is not changed by variations in the thickness of the transparent electrode; therefore, the white-light-emitting diode exhibiting higher brightness and high color rendering properties can be realized with high reproducibility.

A third semiconductor light emitting device according to the present invention emits white light, and is characterized by including: a diode that is formed on a substrate, has an active layer made of InGaAlN, and is capable of emitting blue or ultraviolet light; a transparent electrode that is formed on the diode, and allows transmission of light emitted from the diode; and a plurality of semiconductor layers formed over the transparent electrode and having different compositions.

In the third semiconductor light emitting device according to the present invention, bright red light, green light and blue light can be emitted from respective ones of the plurality of semiconductor layers having different compositions; therefore, if ultraviolet light is emitted from the light emitting diode, for example, it becomes possible to realize a white-light-emitting diode structure having excellent color rendering properties without using any special package.

In the third semiconductor light emitting device according to the present invention, it is preferable that the transparent electrode is made of an ITO material.

In such an embodiment, since the transparent electrode has a high transmittance, luminous intensity is not changed by variations in the thickness of the transparent electrode; therefore, the white-light-emitting diode exhibiting high brightness and high color rendering properties can be realized with high reproducibility.

A fourth semiconductor light emitting device according to the present invention emits white light, and is characterized by including: a diode that has an active layer made of InGaAlN, and is capable of emitting blue or ultraviolet light; a transparent electrode that is formed on the diode, and allows transmission of light emitted from the diode; a semiconductor layer formed on the transparent electrode; a substrate that is formed on the semiconductor layer, and allows transmission of light emitted from the diode and the semiconductor layer; and a phosphor layer made of a phosphor material formed on the substrate.

In the fourth semiconductor light emitting device according to the present invention, bright red light can be emitted from the semiconductor layer, and yellow light can be emitted from the phosphor layer; therefore, if blue light is emitted from the diode, for example, it becomes possible to realize a white-light-emitting diode structure having high brightness and excellent color rendering properties.

In the fourth semiconductor light emitting device according to the present invention, it is preferable that: the device further includes an electrode formed on a surface of the diode opposite to a surface thereof on which the transparent electrode is formed; and the electrode is made of Al, Ag, Rh, Pt, or an alloy or multilayer metal film including any of these metals.

In such an embodiment, since the electrode exhibiting a high-reflection characteristic can be realized, light emitted from the diode is reflected by the high-reflection electrode; therefore, it becomes possible to realize the white-light-emitting diode structure having higher brightness and excellent color rendering properties.

A fifth semiconductor light emitting device according to the present invention emits white light, and is characterized by including: a diode that has an active layer made of InGaAlN, and is capable of emitting blue or ultraviolet light; a transparent electrode that is formed on the diode, and allows transmission of light emitted from the diode; a plurality of semiconductor layers formed over the transparent electrode and having different compositions; and a substrate that is formed over the plurality of semiconductor layers, and allows transmission of light emitted from the diode and the plurality of semiconductor layers.

In the fifth semiconductor light emitting device according to the present invention, bright red light, green light and blue light can be emitted from respective ones of the plurality of semiconductor layers having different compositions; therefore, if ultraviolet light is emitted from the diode, for example, it becomes possible to realize a white-light-emitting diode structure having high brightness and excellent color rendering properties.

In the fifth semiconductor light emitting device according to the present invention, it is preferable that: the device further includes an electrode formed on a surface of the diode opposite to a surface thereof on which the transparent electrode is formed; and the electrode is made of Al, Ag, Rh, Pt, or an alloy or multilayer metal film including any of these metals.

In such an embodiment, since the electrode exhibiting a high-reflection characteristic can be realized, light emission from the diode is reflected by the high-reflection electrode; therefore, it becomes possible to realize the white-light-emitting diode structure having higher brightness and excellent color rendering properties.

A first method for fabricating a phosphor according to the present invention is a method for fabricating a phosphor that emits white light due to excitation by a light emitting diode capable of emitting blue or ultraviolet light. The method is characterized by including the steps of: forming a semiconductor layer on a first substrate made of a single crystal, and then bonding a second substrate that allows transmission of visible light onto a surface of the semiconductor layer opposite to a surface thereof on which the first substrate is formed; separating the first substrate from the semiconductor layer; and forming a phosphor layer made of a phosphor material, on a surface of the second substrate opposite to a surface thereof on which the semiconductor layer is formed, or on a surface of the semiconductor layer opposite to a surface thereof on which the second substrate is formed.

In the first phosphor fabricating method according to the present invention, since the semiconductor layer formed on the single crystal substrate has excellent crystallinity, bright red light, for example, can be emitted from the semiconductor layer. In this case, if blue light is emitted from the light emitting diode, for example, to excite the phosphor layer, yellow light is emitted from the phosphor layer, and therefore, it becomes possible to realize a white-light-emitting diode structure having excellent color rendering properties.

In the first phosphor fabricating method according to the present invention, it is preferable that: the step of forming the phosphor layer includes the step of forming at least a first phosphor layer and a second phosphor layer; and the first phosphor layer and the second phosphor layer emit lights having different center wavelengths due to excitation by the light emitting diode.

In such an embodiment, since the semiconductor layer formed on the single crystal substrate has excellent crystallinity, bright red light can be emitted from the semiconductor layer. In this case, blue light and green light can be emitted from the first and second phosphor layers, respectively, and if ultraviolet light is emitted from the light emitting diode, for example, it becomes possible to realize the white-light-emitting diode structure having excellent color rendering properties.

A second phosphor fabricating method according to the present invention is a method for fabricating a phosphor that emits white light due to excitation by a light emitting diode capable of emitting blue or ultraviolet light. The method is characterized by including the steps of: forming a plurality of semiconductor layers over a first substrate made of a single crystal; bonding a second substrate that allows transmission of visible light onto a surface of the plurality of semiconductor layers opposite to a surface thereof on which the first substrate is formed; and separating the first substrate from the plurality of semiconductor layers.

In the second phosphor fabricating method according to the present invention, since the plurality of semiconductor layers, formed over the single crystal substrate and having different compositions, each have excellent crystallinity, bright red light, green light and blue light can be emitted from the respective layers. In this case, if ultraviolet light is emitted from the light emitting diode, for example, it becomes possible to realize a white-light-emitting diode structure having excellent color rendering properties.

In the second phosphor fabricating method according to the present invention, it is preferable that the step of forming the plurality of semiconductor layers includes the step of forming at least a first semiconductor layer and a second semiconductor layer which emit red light and green light, respectively, due to excitation by the light emitting diode.

In such an embodiment, since red light and green light emitted from the white-light-emitting diode become strong, the white-light-emitting diode structure having excellent color rendering properties can be realized.

In the second phosphor fabricating method according to the present invention, it is preferable that: the first substrate is made of GaAs; the first semiconductor layer is made of InGaAlP; and the second semiconductor layer is made of ZnMgSSe.

In such an embodiment, since the InGaAlP layer having excellent crystallinity can be formed on the GaAs substrate, bright red light can be emitted from the InGaAlP layer, and therefore, the white-light-emitting diode structure having excellent color rendering properties can be realized. Further, since the InGaAlP layer and ZnMgSSe layer having excellent crystallinity can be formed over the GaAs substrate, brighter red light and green light can be emitted from the InGaAlP layer, and blue light can be emitted from the ZnMgSSe layer, thus making it possible to realize the white-light-emitting diode structure having excellent color rendering properties.

In the second phosphor fabricating method according to the present invention, it is preferable that at least one of the first semiconductor layer and the second semiconductor layer has a composition that can be lattice-matched to the first substrate.

In such an embodiment, since the lattice-matched InGaAlP layer having excellent crystallinity can be formed on the GaAs substrate, bright red light can be emitted from the InGaAlP layer; therefore, the white-light-emitting diode structure having excellent color rendering properties can be realized. Further, since the lattice-matched InGaAlP layer and ZnMgSSe layer having excellent crystallinity can be formed over the GaAs substrate, brighter red light and green light can be emitted from the InGaAlP layer, and blue light can be emitted from the ZnMgSSe layer; therefore, the white-light-emitting diode structure having excellent color rendering properties can be realized.

A first method for fabricating a semiconductor light emitting device according to the present invention is a method for fabricating a semiconductor light emitting device that emits white light. The method is characterized by including the steps of: forming, on a first substrate, a diode that has an active layer made of InGaAlN and is capable of emitting blue or ultraviolet light; forming, on a surface of the diode opposite to a surface thereof on which the first substrate is formed, a transparent electrode that allows transmission of light emitted from the diode; forming a semiconductor layer on a second substrate made of a single crystal; bonding together a surface of the transparent electrode opposite to a surface thereof on which the diode is formed, and a surface of the semiconductor layer opposite to a surface thereof on which the second substrate is formed; separating the second substrate from the semiconductor layer; and forming a phosphor layer made of a phosphor material, on a surface of the semiconductor layer opposite to a surface thereof on which the transparent electrode exists.

In the first semiconductor light emitting device fabricating method according to the present invention, since the semiconductor layer having excellent crystallinity can be formed on the second substrate made of a single crystal, bright red light can be emitted from the semiconductor layer, and yellow light can be emitted from the phosphor layer; therefore, if blue light is emitted from the diode, for example, it becomes possible to realize a white-light-emitting diode structure having high brightness and excellent color rendering properties.

In the first semiconductor light emitting device fabricating method according to the present invention, it is preferable that the phosphor layer is formed by a single layer consisting of a YAG phosphor, or a plurality of layers including at least the YAG phosphor.

In such an embodiment, since brighter yellow light can be emitted from the phosphor layer, bright red light can be emitted from the semiconductor layer, and therefore, the white-light-emitting diode structure having excellent color rendering properties can be realized.

A second semiconductor light emitting device fabricating method according to the present invention is a method for fabricating a semiconductor light emitting device that emits white light. The method is characterized by including the steps of forming, on a first substrate, a diode that has an active layer made of InGaAlN and is capable of emitting blue or ultraviolet light; forming, on a surface of the diode opposite to a surface thereof on which the first substrate is formed, a transparent electrode that allows transmission of light emitted from the diode; forming a plurality of semiconductor layers on a second substrate made of a single crystal; bonding together a surface of the transparent electrode opposite to a surface thereof on which the diode is formed, and a surface of the plurality of semiconductor layers opposite to a surface thereof on which the second substrate is formed; and separating the second substrate from the plurality of semiconductor layers.

In the second semiconductor light emitting device fabricating method according to the present invention, since the plurality of semiconductor layers, formed over the single crystal second substrate and having different compositions, have excellent crystallinity, bright red light, green light and blue light can be emitted from the respective semiconductor layers; therefore, if ultraviolet light is emitted from the light emitting diode, for example, it becomes possible to realize a white-light-emitting diode structure having high brightness and excellent color rendering properties.

In the first or second semiconductor light emitting device fabricating method according to the present invention, it is preferable that the first substrate is made of sapphire, SiC, MgO, $LiGaO_2$, $LiAlO_2$, or a mixed crystal of $LiGaO_2$ and $LiAlO_2$.

In such an embodiment, since the crystallinity of the diode, including the active layer made of InGaAlN, is improved, the brightness of the light emitting diode that excites the semiconductor layer(s) and the phosphor layer is increased, and therefore, the white-light-emitting diode having high brightness and excellent color rendering properties can be realized.

A third semiconductor light emitting device fabricating method according to the present invention is a method for fabricating a semiconductor light emitting device that emits white light. The method is characterized by including the steps of: forming, on a first substrate, a diode that has an active layer made of InGaAlN and is capable of emitting blue or ultraviolet light; forming, on a surface of the diode opposite to a surface thereof on which the first substrate is formed, a transparent electrode that allows transmission of light emitted from the diode; forming a semiconductor layer on a second substrate made of a single crystal; bonding a third substrate that allows transmission of visible light onto a surface of the semiconductor layer opposite to a surface thereof on which the second substrate is formed; separating the second substrate from the semiconductor layer; bonding together a surface of the transparent electrode opposite to a surface thereof on which the diode is formed, and a surface of the semiconductor layer opposite to a surface thereof on which the third substrate is formed; and separating the first substrate from the diode, wherein after the step of forming the third substrate, the method further includes the step of forming a phosphor layer made of a phosphor material on a surface of the third substrate opposite to a surface thereof on which the semiconductor layer is formed.

In the third semiconductor light emitting device fabricating method according to the present invention, since the semiconductor layer formed on the single crystal substrate has excellent crystallinity, bright red light can be emitted from the semiconductor layer, and yellow light can be emitted from the phosphor layer; therefore, if blue light is emitted from the light emitting diode, for example, it becomes possible to realize a white-light-emitting diode structure having high brightness and excellent color rendering properties.

In the third semiconductor light emitting device fabricating method according to the present invention, it is preferable that after the step of separating the first substrate from the diode, the method further includes the step of forming, on a surface of the diode opposite to a surface thereof on which the transparent electrode is formed, an electrode made of Al, Ag, Rh, Pt, or an alloy or multilayer metal film including any of these metals.

In such an embodiment, since the electrode exhibiting a high-reflection characteristic can be realized, light emission from the diode is reflected by the high-reflection electrode; therefore, it becomes possible to realize the white-light-emitting diode structure having higher brightness and excellent color rendering properties.

A fourth semiconductor light emitting device fabricating method according to the present invention is a method for fabricating a semiconductor light emitting device that emits white light. The method is characterized by including the steps of: forming, on a first substrate, a diode that has an active layer made of InGaAlN and is capable of emitting blue or ultraviolet light; forming, on a surface of the diode opposite to a surface thereof on which the first substrate is formed, a transparent electrode that allows transmission of light emitted from the diode; forming a plurality of semiconductor layers on a second substrate made of a single crystal; bonding a third substrate that allows transmission of visible light onto a surface of the plurality of semiconductor layers opposite to a surface thereof on which the second substrate is formed; separating the second substrate from the plurality of semiconductor layers; bonding together a surface of the transparent electrode opposite to a surface thereof on which the diode is formed, and a surface of the plurality of semiconductor layers opposite to a surface thereof on which the third substrate is formed; and separating the first substrate from the diode.

In the fourth semiconductor light emitting device fabricating method according to the present invention, since the plurality of semiconductor layers, formed over the single crystal substrate and having different compositions, have excellent crystallinity, bright red light, green light and blue light can be emitted therefrom; therefore, if ultraviolet light is emitted from the diode, for example, it becomes possible to realize a white-light-emitting diode structure having high brightness and excellent color rendering properties.

In the fourth semiconductor light emitting device fabricating method according to the present invention, it is preferable that after the step of separating the first substrate from the diode, the method further includes the step of forming, on a surface of the diode opposite to a surface thereof on which the transparent electrode is formed, an electrode made of Al, Ag, Rh, Pt, or an alloy or multilayer metal film including any of these metals.

In such an embodiment, since the electrode exhibiting a high-reflection characteristic can be realized, light emission from the diode is reflected by the high-reflection electrode; therefore, it becomes possible to realize the white-light-emitting diode structure having higher brightness and excellent color-rendering properties.

In the third or fourth semiconductor light emitting device fabricating method according to the present invention it is preferable that the step of separating the first substrate from the diode includes the step of removing the first substrate by irradiating it with light from a surface of the first substrate opposite to a surface thereof on which the diode is formed.

In such an embodiment, a part of the diode including the InGaAlN layer formed on the substrate is irradiated with the light and is thus decomposed; therefore, the first substrate can be separated from the diode at a large area and with a high reproducibility.

In the third or fourth semiconductor light emitting device fabricating method according to the present invention, it is preferable that the light is a pulse-oscillated laser.

In such an embodiment, since the output power of the light can be considerably increased, the first substrate can be easily separated from the diode.

In the third or fourth semiconductor light emitting device fabricating method according to the present invention, it is preferable that the light is an emission line of a mercury lamp.

In such an embodiment, even though optical power is inferior to that of the laser, a spot size can be increased, and therefore, the first substrate can be separated from the diode in a short period of time.

In the third or fourth semiconductor light emitting device fabricating method according to the present invention, it is preferable that the step of separating the first substrate from the diode includes the step of removing the first substrate by polishing, thus separating the first substrate.

In such an embodiment, the first substrate can be separated from the diode at a large area and at a low cost.

DESCRIPTION OF THE DRAWINGS

FIGS. 9(a) through 9(g) are cross-sectional views illustrating process steps of a method for fabricating the semiconductor light emitting device according to the fourth embodiment of the present invention.

FIGS. 15(a) through 15(i) are cross-sectional views illustrating process steps of a method for fabricating the semiconductor light emitting device according to the seventh embodiment of the present invention.

EMBODIMENTS OF THE INVENTION

Hereinafter, respective embodiments of the present invention will be described with reference to the drawings.

It should be noted that in each of the following embodiments, InGaAlP represents a composition such as $In_{x1}Ga_{1-x1-y1}Al_{y1}P$ (where $0 \leq x1 \leq 1$, and $0 \leq y1 \leq 1$), and InGaAlN represents a composition such as $In_{x2}Ga_{1-x2-y2}Al_{y2}N$ (where $0 \leq x2 \leq 1$, and $0 \leq y2 \leq 1$). Further, ZnMgSSe represents a composition such as $Zn_{1-x3}Mg_{x3}S_{y3}Se_{1-y3}$ (where $0 \leq x3 \leq 1$, and $0 \leq y3 \leq 1$).

First Embodiment

Hereinafter, a phosphor according to a first embodiment of the present invention will be described with reference to FIG. 1, FIG. 2, and FIGS. 3(a) through 3(e).

First, the structure of the phosphor according to the first embodiment of the present invention will be described with reference to FIG. 1 and FIG. 2.

Figure 1:
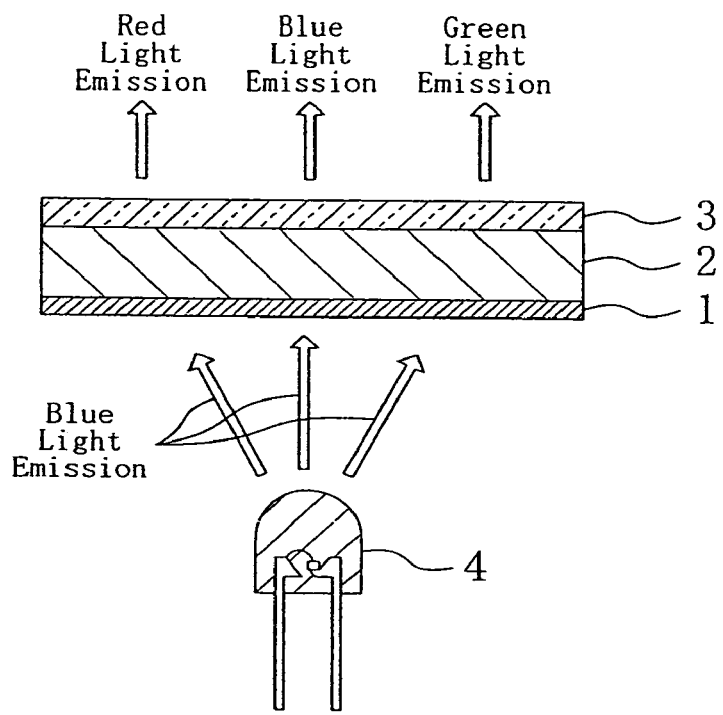
FIG. 1 is a structural cross-sectional view illustrating a phosphor according to a first embodiment of the present invention, and a blue-light-emitting diode used to excite the phosphor.

FIG. 1 is a cross-sectional view illustrating the phosphor according to the first embodiment of the present invention and a blue-light-emitting diode used to excite the phosphor.

As shown in FIG. 1, an undoped InGaAlP layer 1 that emits red light due to excitation by a blue-light-emitting diode 4 is pasted on one principal surface of a quartz substrate 2, while a YAG phosphor 3 that emits yellow light due to excitation by the blue-light-emitting diode 4 is formed on the other principal surface of the quartz substrate 2.

Thus, the phosphor according to the first embodiment of the present invention has the structure made up of the InGaAlP layer 1, the quartz substrate 2 and the YAG phosphor 3.

In this embodiment, the InGaAlP layer 1 is formed by, for example, an $In_{0.49}Ga_{0.51}P$ layer, has a band gap of 1.9 eV, and emits red light having a wavelength of 650 nm. Furthermore, if the InGaAlP layer 1 is formed by the $In_{0.49}Ga_{0.51}P$ layer, the InGaAlP layer 1 is lattice-matched to GaAs to enable crystal growth; therefore, as also described in the after-mentioned fabrication method, the InGaAlP layer 1 can realize a low defect density, and thus the InGaAlP layer 1 can be expected to emit light at a high luminous efficiency.

Figure 2:
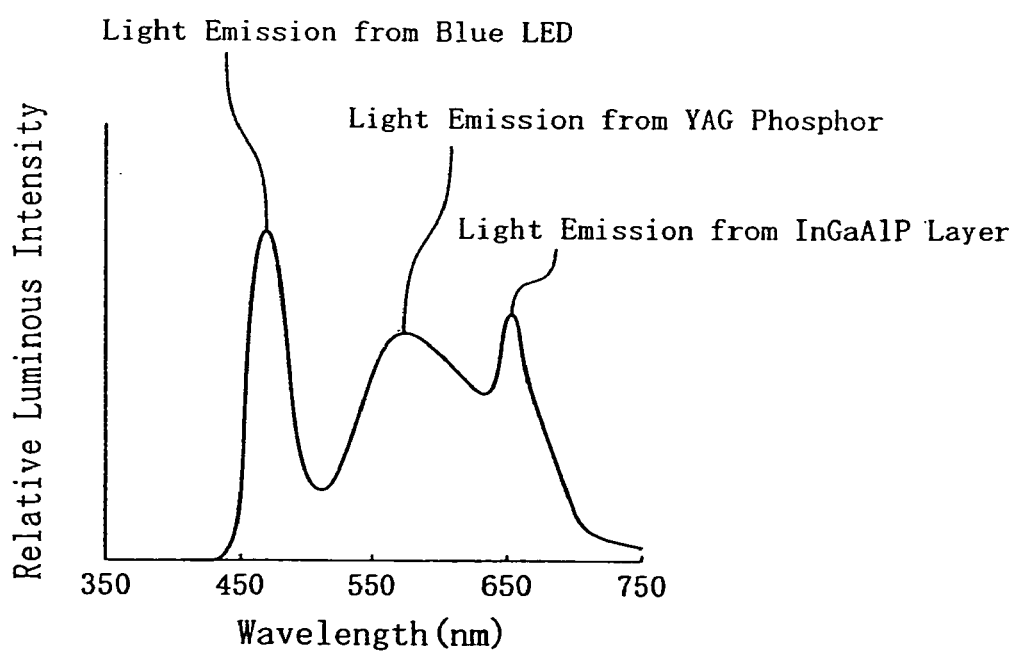
FIG. 2 is a graph illustrating emission spectrum in the case where the phosphor according to the first embodiment of the present invention is excited by a blue-light-emitting diode.

By irradiating the phosphor according to the first embodiment of the present invention, having such a structure, with excitation light having a wavelength of, for example, 470 nm from the high-power blue-light-emitting diode 4, the phosphor according to the first embodiment of the present invention can emit white light having a spectrum shown in FIG. 2. As apparent from FIG. 2, the emission spectrum is formed by: transmitted blue light emission (having a wavelength of 470 nm) from the blue-light-emitting diode 4; yellow light emission (having a peak wavelength of 550 nm) from the YAG phosphor 3; and red light emission (having a wavelength of 650 nm) from the InGaAlP layer 1. Therefore, a white-light-emitting diode structure that emits white light can be realized by the phosphor according to the first embodiment of the present invention and the blue-light-emitting diode 4.

As described above, in the first embodiment of the present invention, the InGaAlP layer 1 and the YAG phosphor 3 are excited using the blue-light-emitting diode 4, and thus the emission in a red light emission region is stronger compared with a conventional white-light-emitting diode that emits white light by exciting a YAG phosphor using a blue-light-emitting diode. Accordingly, it is possible to realize the white-light-emitting diode structure that emits white light with excellent color rendering properties.

Secondly, a method for fabricating the phosphor according to the first embodiment of the present invention shown in FIG. 1, and a method for fabricating a semiconductor light emitting device on which the phosphor is integrated will be described with reference to FIGS. 3(a) through 3(e).

FIGS. 3(a) through 3(e) are cross-sectional views illustrating principal process steps of a method for fabricating the phosphor according to the first embodiment of the present invention and a method for fabricating the semiconductor light emitting device on which the phosphor is integrated. It should be noted that in FIGS. 3(a) through 3(e), the same components as those shown in FIG. 1 are identified by the same reference numerals.

Figure 3A:
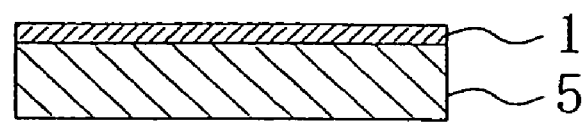
FIGS. 3(a) through 3(e) are cross-sectional views illustrating process steps of a method for fabricating the phosphor according to the first embodiment of the present invention and a method for fabricating a semiconductor light emitting device on which the phosphor is integrated.

First, as shown in FIG. 3(a), an undoped InGaAlP layer 1 is formed on, for example, a GaAs substrate 5 by a metal organic chemical vapor deposition (MOCVD) process. As the GaAs substrate 5, a substrate having, at its (100) plane, a plane orientation that is about 10° off in the (011) direction is used. Furthermore, the InGaAlP layer 1 has a composition lattice-matched to the GaAs substrate 5, and in this process step, the InGaAlP layer 1 is formed by an $In_{0.49}Ga_{0.51}P$ layer having a thickness of about 1 µm. In this way, since the InGaAlP layer 1 can realize a low defect density, the InGaAlP layer 1 can be expected to emit light at a high luminous efficiency.

Figure 3B:
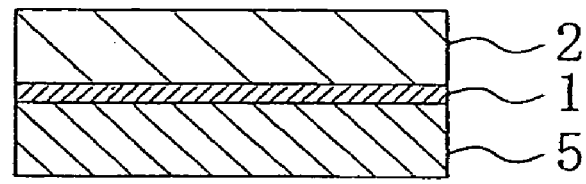

Next, as shown in FIG. 3(b), a quartz substrate 2 and the GaAs substrate 5 having the InGaAlP layer 1 are pasted together such that the quartz substrate 2 is bonded onto the InGaAlP layer 1. In this process step, a method for pasting the quartz substrate 2 and the InGaAlP layer 1 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

Figure 3C:
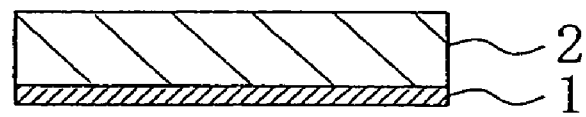

Subsequently, as shown in FIG. 3(c), the GaAs substrate 5 is immersed in a mixed solution of, for example, $H_2SO_4$ and $H_2O_2$, thereby removing the GaAs substrate 5 by wet etching. Thus, a structure in which the InGaAlP layer 1 is bonded to the quartz substrate 2 is obtained.

Figure 3D:
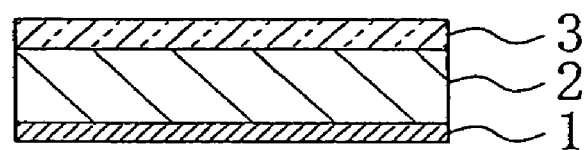

Thereafter, as shown in FIG. 3(d), a YAG phosphor 3 is applied onto a surface of the quartz substrate 2 at the side where the InGaAlP layer 1 is not formed. In this process step, the quartz substrate 2 may be polished and formed into a film before the application of the YAG phosphor 3 such that the thickness of the quartz substrate 2 becomes 100 µm or less, for example. Thus, the structure of the phosphor shown in FIG. 1 can be realized.

Figure 3E:
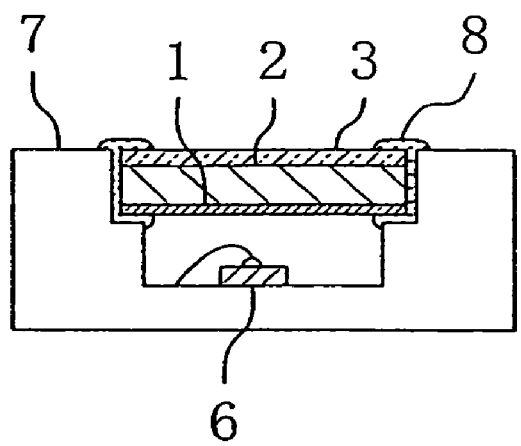

Then, as shown in FIG. 3(e), after the phosphor having the structure shown in FIG. 3(d) has been diced into, for example, a size of about 1 mm×about 1 mm, the diced phosphor is bonded to a package 7 using an adhesive 8, for example, and a blue-light-emitting diode chip 6 is integrated within the package 7. Thus, as in the case of the blue-light-emitting diode 4 shown in FIG. 1, red light can be emitted from the InGaAlP layer 1 due to excitation by emission of blue light having a wavelength of, for example, 470 nm, from the blue-light-emitting diode chip 6, and therefore, it becomes possible to obtain a white-light-emitting diode that emits white light with excellent color rendering properties. As can be seen, for example, in FIG. 3(e), the light emitting diode chip 6 can be placed apart from the phosphor apparatus and is not attached to the substrate 2.

It should be noted that in the present embodiment, a sapphire substrate may be used instead of the quartz substrate 2.

Moreover, in the present embodiment, even in the case of a structure in which the quartz substrate 2 and the blue-light-emitting diode chip 6 are integrated within the package 7, the effects similar to those described above can be achieved.

Second Embodiment

Hereinafter, a phosphor according to a second embodiment of the present invention will be described with reference to above-mentioned FIGS. 3(a) through 3(e), FIG. 4 and FIG. 5.

First, the structure of the phosphor according to the second embodiment of the present invention will be described with reference to FIG. 4.

Figure 4:
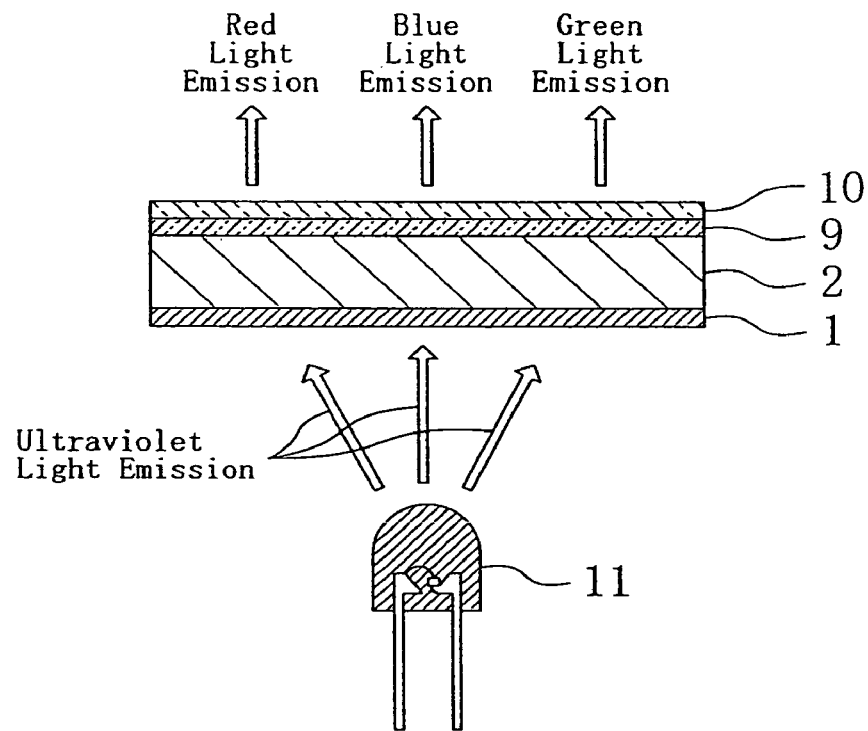
FIG. 4 is a structural cross-sectional view illustrating a phosphor according to a second embodiment of the present invention, and an ultraviolet-light-emitting diode used to excite the phosphor.

FIG. 4 is a cross-sectional view illustrating the phosphor according to the second embodiment of the present invention and an ultraviolet-light-emitting diode used to excite the phosphor.

As shown in FIG. 4, an undoped InGaAlP layer 1 that emits red light due to excitation by an ultraviolet-light-emitting diode 11 is pasted on one principal surface of a quartz substrate 2, while a green-light-emitting phosphor 9 that emits green light due to excitation by the ultraviolet-light-emitting diode 11 and a blue-light-emitting diode 10 that emits blue light due to excitation by the ultraviolet-light-emitting diode 11 are formed in this order over the other principal surface of the quartz substrate 2.

In this embodiment, as a material constituting the green-light-emitting phosphor 9, $Zn_2SiO_4$ to which Mn is added ($Zn_2SiO_4$: Mn), $BaAl_{12}O_{19}$ to which Mn is added ($BaAl_{12}O_{19}$: Mn), $CeMgAl_{11}$ to which Tb is added (CeMgAl$_{11}$: Tb), $BaMgAl_{10}O_{17}$ to which $Eu^{2+}$ and $Mn^{2+}$ are added ($BaMgAl_{10}O_{17}$: $Eu^{2+}$, $Mn^{2+}$), or $Y_2SiO_5$ to which $Ce^{3+}$ and $Tb^{3+}$ are added ($Y_2SiO_5$: $Ce^{3+}$, $Tb^{3+}$) may be used.

On the other hand, as a material constituting the blue-light-emitting phosphor 10, $BaMgAl_{14}O_{23}$ to which Eu is added ($BaMgAl_{14}O_{23}$: Eu), $YP_{0.85}V_{0.15}O_4$, $BaMg_2Al_{14}$ to which Eu is added ($BaMg_2Al_{14}$: Eu), $(Sr, Ca)_{10}(PO_4)_6Cl_2$ to which $Eu^{2+}$ is added ($(Sr, Ca)_{10}(PO_4)_6Cl_2$: $Eu^{2+}$), or $BaMgAl_{10}O_{17}$ to which $Eu^{2+}$ is added ($BaMgAl_{10}O_{17}$: $Eu^{2+}$) may be used.

Thus, the phosphor according to the second embodiment of the present invention has the structure made up of the InGaAlP layer 1, the quartz substrate 2, the green-light-emitting phosphor 9, and the blue-light-emitting phosphor 10.

In this embodiment, like the first embodiment, the InGaAlP layer 1 is formed by, for example, an $In_{0.49}Ga_{0.51}P$ layer, has a band gap of 1.9 eV, and emits red light having a wavelength of 650 mm. Furthermore, if the InGaAlP layer 1 is formed by the $In_{0.49}Ga_{0.51}P$ layer, the InGaAlP layer 1 is lattice-matched to GaAs to enable crystal growth; therefore, as also described in the after-mentioned fabrication method, the InGaAlP layer 1 can realize a low defect density, and thus the InGaAlP layer 1 can be expected to emit light at a high luminous efficiency.

Figure 5:
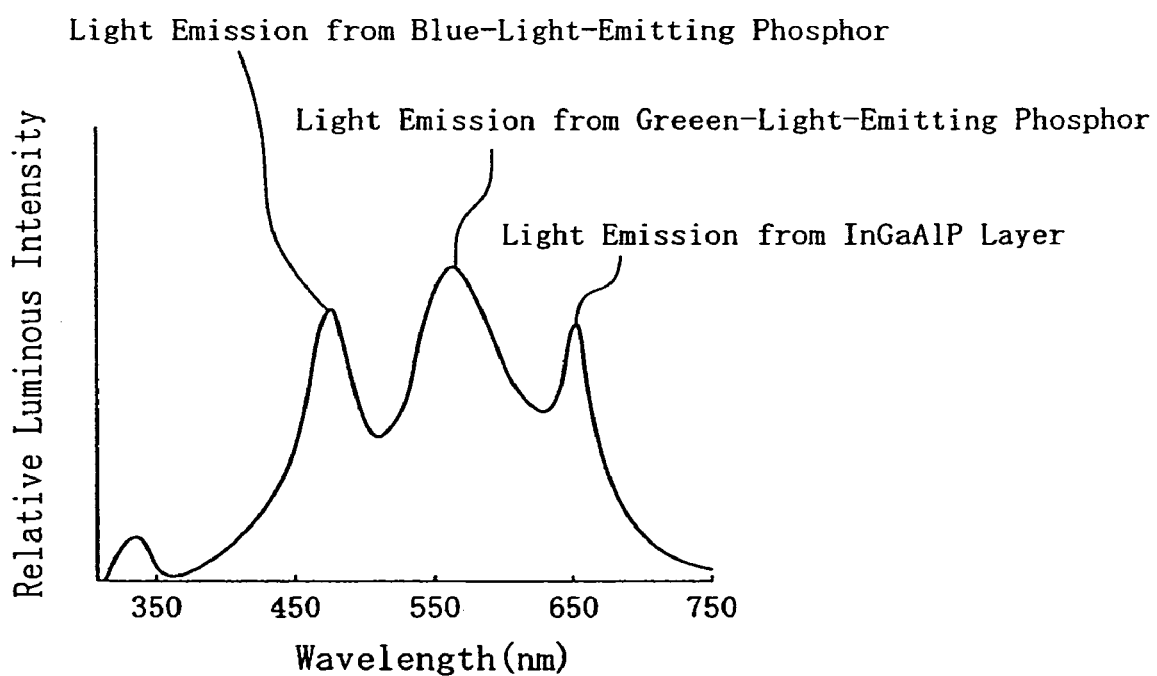
FIG. 5 is a graph illustrating emission spectrum in the case where the phosphor according to the second embodiment of the present invention is excited by an ultraviolet-light-emitting diode.

By irradiating the phosphor according to the second embodiment of the present invention, having such a structure, with excitation light having a wavelength of, for example, 340 mm from the high-power ultraviolet-light-emitting diode 11, the phosphor according to the second embodiment of the present invention can emit white light having a spectrum shown in FIG. 5. As apparent from FIG. 5, the emission spectrum is formed by: transmitted ultraviolet light emission (having a wavelength of 340 nm) from the ultraviolet-light-emitting diode 11, although which is very small; green light emission (having a peak wavelength of 550 nm) from the green-light-emitting phosphor 9; blue light emission (having a peak wavelength of 470 mm) from the blue-light-emitting diode 10; and red light emission (having a wavelength of 650 nm) from the InGaAlP layer 1. Therefore, a white-light-emitting diode structure that emits white light can be realized by the phosphor according to the second embodiment of the present invention and the ultraviolet-light-emitting diode 11.

As described above, in the second embodiment of the present invention, the InGaAlP layer 1, green-light-emitting phosphor 9 and blue-light-emitting phosphor 10 are excited using the ultraviolet-light-emitting diode 11, and thus the emission in a red light emission region is stronger and the output balance of three colors, i.e., blue, green and red, is better compared with a conventional white-light-emitting diode that emits white light by exciting a YAG phosphor using a blue-light-emitting diode. Accordingly, it is possible to realize the white-light-emitting diode structure that emits white light with excellent color rendering properties.

Secondly, a method for fabricating the phosphor according to the second embodiment of the present invention shown in FIG. 4, and a method for fabricating a semiconductor light emitting device on which the phosphor is integrated will be described.

There are many commonalities between the methods for fabricating the phosphor according to the second embodiment of the present invention shown in FIG. 4 and the semiconductor light emitting device on which the phosphor is integrated, and the methods for fabricating the phosphor according to the first embodiment of the present invention and the semiconductor light emitting device on which the phosphor is integrated. Therefore, the description will be made with reference to above-mentioned FIGS. 3($a$) through 3($e$) again.

First, as described with reference to above-mentioned FIGS. 3($a$) through 3($c$), the structure in which the InGaAlP layer 1 and the quartz substrate 2 are bonded together is obtained.

Next, the green-light-emitting phosphor 9 and the blue-light-emitting phosphor 10 may be formed in this order over a surface of the quartz substrate 2 at the side where the InGaAlP layer 1 is not formed as shown in above-mentioned FIG. 3($d$). Thus, the structure of the phosphor shown in FIG. 4 can be obtained.

Then, as shown in above-mentioned FIG. 3($e$), after the phosphor according to the second embodiment of the present invention has been diced like the description made with reference to the FIG. 3($e$), the diced phosphor is bonded to the package 7 using, for example, the adhesive 8 or the like, and an ultraviolet-light-emitting diode chip is integrated within the package 7. Thus, as in the case of the ultraviolet-light-emitting diode 11 shown in FIG. 4, red light can be emitted from the InGaAlP layer 1 due to excitation by emission of ultraviolet light having a wavelength of, for example, 340 nm from the ultraviolet-light-emitting diode chip, and therefore, it becomes possible to obtain a white-light-emitting diode that emits white light with excellent color rendering properties.

It should be noted that in the present embodiment, a sapphire substrate may be used instead of the quartz substrate 2.

Moreover, in the present embodiment, even in the case of a structure in which the quartz substrate 2 and the ultraviolet-light-emitting diode chip are integrated within the package 7, the effects similar to those described above can be achieved.

Third Embodiment

Hereinafter, a phosphor according to a third embodiment of the present invention will be described with reference to above-mentioned FIG. 5, FIG. 6, and FIGS. 7($a$) through 7($d$).

First, the structure of the phosphor according to the third embodiment of the present invention will be described with reference to FIG. 6.

Figure 6:
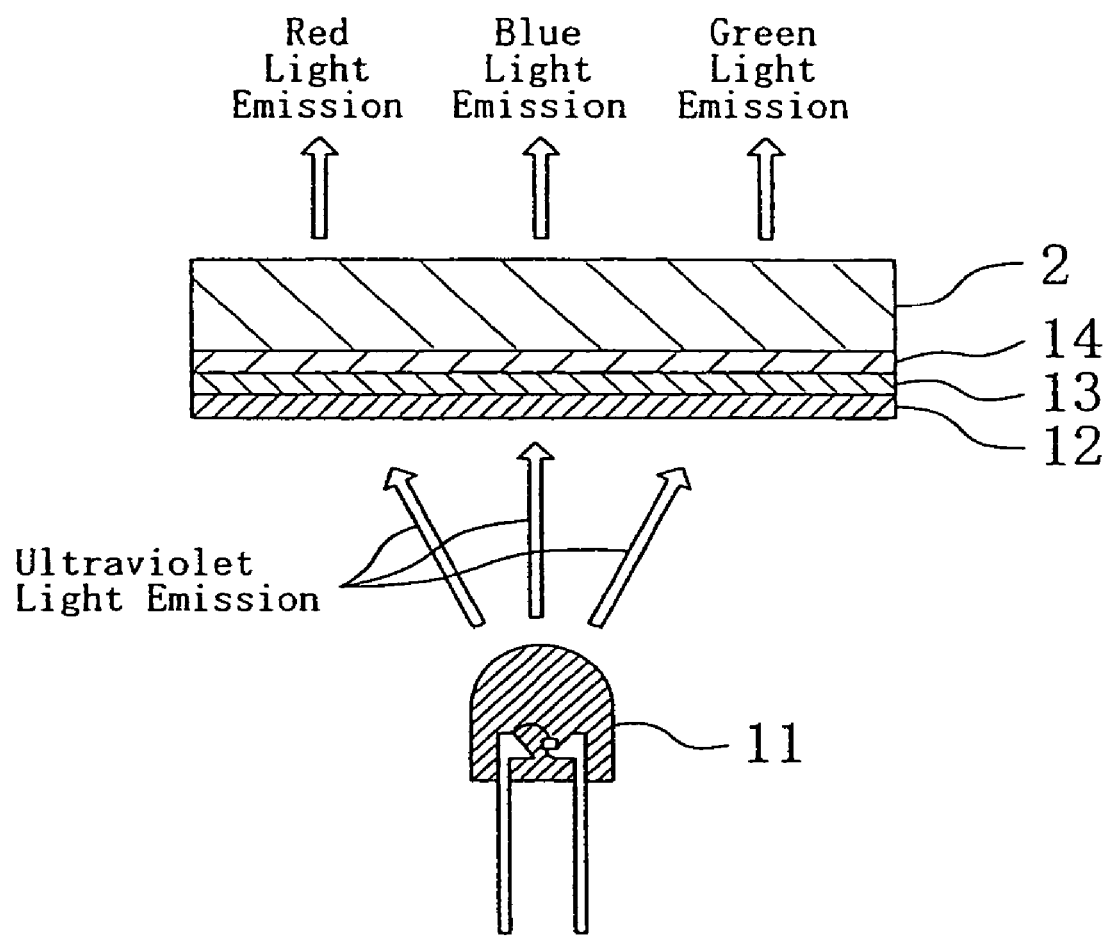
FIG. 6 is a structural cross-sectional view illustrating a phosphor according to a third embodiment of the present invention, and an ultraviolet-light-emitting diode used to excite the phosphor.

FIG. 6 is a cross-sectional view illustrating the phosphor according to the third embodiment of the present invention and an ultraviolet-light-emitting diode used to excite the phosphor.

As shown in FIG. 6, a ZnMgSSe layer 14 that emits blue light due to excitation by an ultraviolet-light-emitting diode 11, an undoped second InGaAlP layer 13 that emits green light due to excitation by the ultraviolet-light-emitting diode 11, and an undoped first InGaAlP layer 12 that emits red light due to excitation by the ultraviolet-light-emitting diode are formed in this order over one principal surface of a quartz substrate 2.

Thus, the phosphor according to the third embodiment of the present invention has the structure made up of the quartz substrate 2, the first InGaAlP layer 12, the second InGaAlP layer 13, and the ZnMgSSe layer 14.

In this embodiment, the first InGaAlP layer 12 is formed by, for example, an $In_{0.48}Ga_{0.52}P$ layer, has a band gap of 1.9 eV, and emits red light having a wavelength of 650 nm. Further, the second InGaAlP layer 13 is formed by, for example, an $In_{0.48}Ga_{0.08}Al_{0.04}P$ layer, has a band gap of 2.3 eV, and emits green light having a wavelength of 550 nm. Furthermore, the ZnMgSSe layer 14 is formed by, for example, a $Zn_{0.95}Mg_{0.05}S_{0.06}Se_{0.94}$ layer, has a band gap of 2.6 eV, and emits blue light having a wavelength of 470 nm.

Besides, if the first InGaAlP layer 12, second InGaAlP layer 13 and ZnMgSSe layer 14 are formed by the $In_{0.48}Ga_{0.52}P$ layer, $In_{0.48}Ga_{0.08}Al_{0.04}P$ layer and $Zn_{0.95}Mg_{0.05}S_{0.06}Se_{0.94}$ layer, respectively, the first InGaAlP layer 12, second InGaAlP layer 13 and ZnMgSSe layer 14 are lattice-matched to GaAs to enable crystal growth; therefore, as also described in the after-mentioned fabrication method, each of the layers can realize a low defect density, and thus each of the layers can be expected to emit light at a high luminous efficiency.

By irradiating the phosphor according to the third embodiment of the present invention, having such a structure, with excitation light having a wavelength of, for example, 340 nm from the high-power ultraviolet-light-emitting diode 11, the phosphor according to the third embodiment of the present invention can emit white light having the spectrum shown in FIG. 5 as in the second embodiment. As apparent from FIG. 5, the emission spectrum is formed by: transmitted ultraviolet light emission (having a wavelength of 340 nm) from the ultraviolet-light-emitting diode 11; red light emission (having a wavelength of 650 nm) from the first InGaAlP layer 12; green light emission (having a wavelength of 550 nm) from the second InGaAlP layer 13; and blue light emission (having a wavelength of 470 nm) from the ZnMgSSe layer 14. Therefore, a white-light-emitting diode structure that emits white light can be realized by the phosphor according to the third embodiment of the present invention and the ultraviolet-light-emitting diode 11.

As described above, in the third embodiment of the present invention, the first InGaAlP layer 12, second InGaAlP layer 13 and ZnMgSSe layer 14 are excited using the ultraviolet-light-emitting diode 11, and thus the emission in a red light emission region is stronger and the output balance of three colors, i.e., blue, green and red, is better compared with a conventional white-light-emitting diode that emits white light by exciting a YAG phosphor using a blue-light-emitting diode. Accordingly, it is possible to realize the white-light-emitting diode structure that emits white light with excellent color rendering properties.

Secondly, a method for fabricating the phosphor according to the third embodiment of the present invention shown in FIG. 6, and a method for fabricating a semiconductor light emitting device on which the phosphor is integrated will be described with reference to FIGS. 7(a) through 7(d).

FIGS. 7(a) through 7(d) are cross-sectional views illustrating the principal process steps of a method for fabricating the phosphor according to the third embodiment of the present invention and a method for fabricating the semiconductor light emitting device on which the phosphor is integrated. It should be noted that in FIGS. 7(a) through 7(d), the same components as those shown in FIG. 6 are identified by the same reference numerals.

Figure 7A:
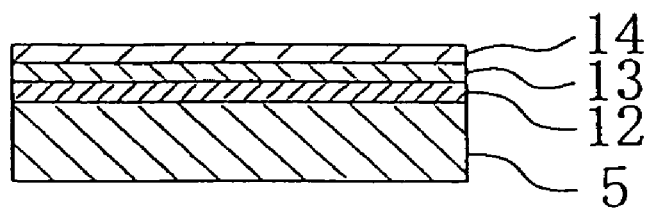
FIGS. 7(a) through 7(d) are cross-sectional views illustrating process steps of a method for fabricating the phosphor according to the third embodiment of the present invention and a semiconductor light emitting device on which the phosphor is integrated.

First, as shown in FIG. 7(a), an undoped first InGaAlP layer 12 and an undoped second InGaAlP layer 13 are formed in this order over, for example, a GaAs substrate 5 by a metal organic chemical vapor deposition (MOCVD) process. Further, a ZnMgSSe layer 14 is formed on the second InGaAlP layer 13.

In this method, as the GaAs substrate 5, a substrate having, at its (100) plane, a plane orientation that is about 10° off in the (011) direction is used. Furthermore, the first InGaAlP layer 12, second InGaAlP layer 13 and ZnMgSSe layer 14 each have a composition lattice-matched to the GaAs substrate 5; in addition, the first InGaAlP layer 12 is formed by an $In_{0.48}Ga_{0.52}P$ layer having a thickness of about 1 μm, the second InGaAlP layer 13 is formed by an $In_{0.48}Ga_{0.08}Al_{0.04}P$ layer having a thickness of about 1 μm, and the ZnMgSSe layer 14 is formed by a $Zn_{0.95}Mg_{0.05}S_{0.06}Se_{0.94}$ layer having a thickness of about 1 μm. In this way, since the first InGaAlP layer 12, second InGaAlP layer 13 and ZnMgSSe layer 14 can each realize a low defect density, each of the layers can be expected to emit light at a high luminous efficiency.

Besides, the first InGaAlP layer 12 emits red light due to excitation by ultraviolet light, the second InGaAlP layer 13 emits green light due to excitation by ultraviolet light, and the ZnMgSSe layer 14 emits blue light due to excitation by ultraviolet light.

Figure 7B:
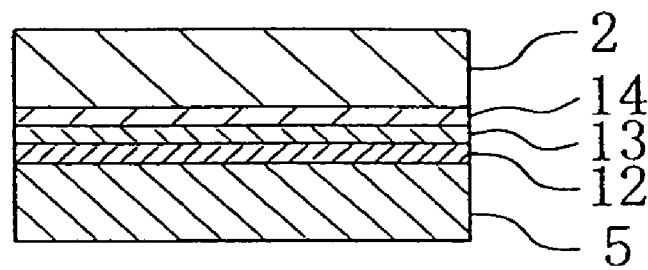

Next, as shown in FIG. 7(b), a quartz substrate 2 and the GaAs substrate 5, having the first InGaAlP layer 12, second InGaAlP layer 13 and ZnMgSSe layer 14, are pasted together such that the quartz substrate 2 is bonded onto the ZnMgSSe layer 14. In this process step, a method for pasting the quartz substrate 2 and the ZnMgSSe layer 14 together may be a method for bonding them together in an aqueous solution, or may be a method for bonding them together by applying heat or pressure thereto. An adhesive such as epoxy, for example, may be used to paste them together.

Figure 7C:
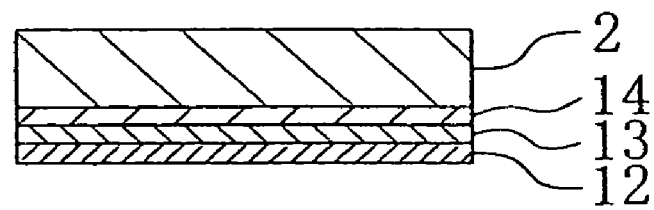

Subsequently, as shown in FIG. 7(c), the GaAs substrate 5 is immersed in a mixed solution of, for example, $H_2SO_4$ and $H_2O_2$, thereby removing the GaAs substrate 5 by wet etching. Thus, a structure in which the first InGaAlP layer 12, second InGaAlP layer 13 and ZnMgSSe layer 14 are bonded to the quartz substrate 2 is obtained. In this process step, the quartz substrate 2 may be polished and formed into a film such that the thickness of the quartz substrate 2 becomes 100 μm or less, for example. Thus, the structure of the phosphor shown in FIG. 6 can be obtained.

Figure 7D:
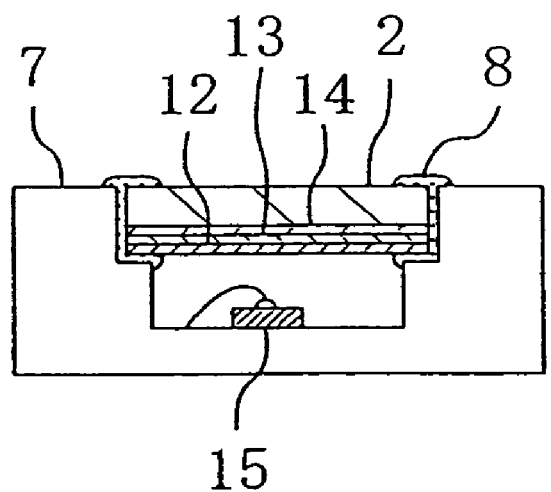

Then, as shown in FIG. 7(d), after the phosphor having the structure shown in FIG. 7(c) has been diced into, for example, a size of about 1 mm×about 1 mm, the diced phosphor is bonded to a package 7 using, for example, an adhesive 8 or the like, and an ultraviolet-light-emitting diode chip 15 is integrated within the package 7. Thus, as in the case of the ultraviolet-light-emitting diode 11 shown in FIG. 6, red light can be emitted from the first InGaAlP layer 12 due to excitation by emission of ultraviolet light having a wavelength of, for example, 340 nm the ultraviolet-light-emitting diode chip 15, and therefore, it becomes possible to realize a white-light-emitting diode structure that emits white light with excellent color rendering properties.

It should be noted that in the present embodiment, a sapphire substrate may be used instead of the quartz substrate 2.

Moreover, in the present embodiment, even in the case of a structure in which the quartz substrate 2 and the ultraviolet-light-emitting diode chip 15 are integrated within the package 7, the effects similar to those described above can be achieved.

Fourth Embodiment

Hereinafter, a semiconductor light emitting device according to a fourth embodiment of the present invention will be described with reference to above-mentioned FIG. 2, FIG. 8, and FIGS. 9(a) through 9(g).

First, the structure of the semiconductor light emitting device according to the fourth embodiment of the present invention will be described.

Figure 8:
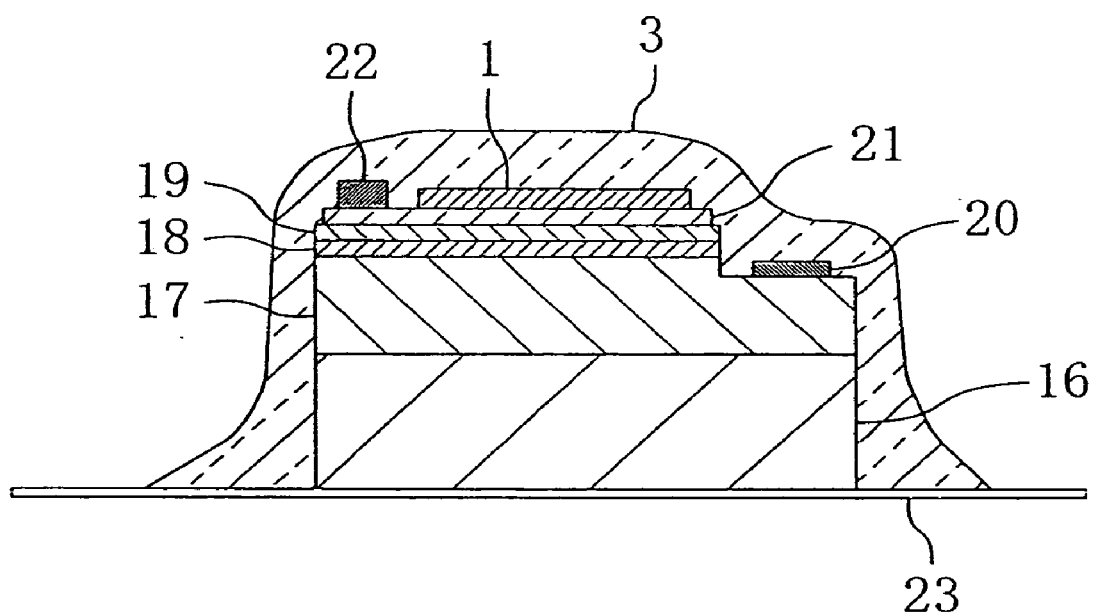
FIG. 8 is a structural cross-sectional view illustrating a semiconductor light emitting device according to a fourth embodiment of the present invention.

FIG. 8 is a cross-sectional view illustrating the structure of the semiconductor light emitting device according to the fourth embodiment of the present invention, and FIG. 8 specifically illustrates a white-light-emitting diode structure formed by combining a YAG phosphor, a phosphor layer made of InGaAlP, and a blue-light-emitting diode.

As shown in FIG. 8, a sapphire substrate 16 is formed on a package surface 23, and an n-type InGaAlN layer 17, an active layer 18 made of InGaAlN and a p-type InGaAlN layer 19 are formed in this order from below over the sapphire substrate 16. Further, an electrode 20 made of Ti/Au is formed on the n-type InGaAlN layer 17, and an ITO transparent electrode 21 is formed on the p-type InGaAlN layer 19. In this embodiment, other than Ti/Au, as a material for the electrode 20, Al, Ag, Rh, Pt, or an alloy or multilayer metal film including any of these metals may be used, thus making it possible to realize the electrode exhibiting a high-reflection characteristic. On the ITO transparent electrode 21, an electrode 22 made of Au is selectively formed. Further, on the ITO transparent electrode 21, an undoped InGaAlP layer 1 is formed. Furthermore, this structure is covered with a YAG phosphor 3 on the package surface 23.

As described above, the semiconductor light emitting device shown in FIG. 8 has the structure functioning as a white-light-emitting diode formed by combining the YAG phosphor 3, the InGaAlP layer 1 and the blue-light-emitting diode. Specifically, the semiconductor light emitting device shown in FIG. 8 has the structure in which the InGaAlP layer 1 that emits red light due to excitation by the blue-light-emitting diode, and the YAG phosphor 3 that emits yellow light due to excitation by the blue-light-emitting diode are formed over the blue-light-emitting diode having the InGaAlN active layer 18, with the ITO transparent electrode 21 sandwiched between the blue-light-emitting diode and the InGaAlP layer 1 and YAG phosphor 3. Therefore, the semiconductor light emitting device functions as a white-light-emitting diode.

In this embodiment, the InGaAlP layer 1 is formed by, for example, an $In_{0.49}Ga_{0.51}P$ layer, has a band gap of 1.9 eV, and emits red light having a wavelength of 650 nm. Moreover, if the InGaAlP layer 1 is formed by the $In_{0.49}Ga_{0.51}P$ layer, the InGaAlP layer 1 is lattice-matched to GaAs to enable crystal growth; therefore, as also described in the after-mentioned fabrication method, the InGaAlP layer 1 can realize a low defect density, and thus the InGaAlP layer 1 can be expected to emit light at a high luminous efficiency.

By irradiating the InGaAlP layer 1 and YAG phosphor 3 with excitation light having a wavelength of, for example, 470 nm from the high-power blue-light-emitting diode having the active layer 18, the semiconductor light emitting device according to the fourth embodiment of the present invention can emit white light having a spectrum similar to that shown in above-mentioned FIG. 2. As apparent from above-mentioned FIG. 2, the emission spectrum is formed by: transmitted blue light emission (having a wavelength of 470 nm) from the blue-light-emitting diode; yellow light emission (having a peak wavelength of 550 nm) from the YAG phosphor 3; and red light emission (having a wavelength of 650 nm) from the InGaAlP layer 1. Therefore, the semiconductor light emitting device shown in FIG. 8 can function as a light emitting diode that emits white light.

As described above, in the semiconductor light emitting device according to the fourth embodiment of the present invention, the InGaAlP layer 1 and the YAG phosphor 3 are excited using the blue-light-emitting diode, and thus the emission in a red light emission region is stronger compared with a conventional white-light-emitting diode that emits white light by exciting a YAG phosphor using a blue-light-emitting diode. Accordingly, it is possible to realize the white-light-emitting diode structure that emits white light with excellent color rendering properties.

Secondly, a method for fabricating the semiconductor light emitting device according to the fourth embodiment of the present invention shown in FIG. 8 will be described with reference to FIGS. 9(a) through 9(g).

As shown in FIG. 9(a), an n-type InGaAlN layer 17, an active layer 18 made of InGaAlN, and a p-type InGaAlN layer 19 are epitaxially grown in this order over a sapphire substrate 16 by a metal organic chemical vapor deposition (MOCVD) process. In this method, a GaN buffer layer or undoped GaN layer grown at about 500° C., for example, may be inserted between the sapphire substrate 16 and the n-type InGaAlN layer 17. Further, the active layer 18 may include a multiple quantum well structure formed by InGaN in which the composition of In is varied. Subsequently, in order to activate the p-type InGaAlN layer 19, annealing is performed at 700° C. for about one hour in an $N_2$ gas atmosphere, for example. Thereupon, an ITO transparent electrode 21 is formed to a thickness of about 300 nm on the p-type InGaAlN layer 19 by an RF sputtering process, for example. In order to reduce the resistance of the ITO transparent electrode 21, annealing may be performed in an $O_2$ atmosphere, for example. In that case, the annealing for activating the p-type InGaAlN layer 19 may be omitted, and only the annealing for reducing the resistance of the ITO transparent electrode 21 may be performed. Thus, a wafer 1 shown in FIG. 9(a) is formed. The wafer 1 has a blue-light-emitting diode structure, and emits blue light having a wavelength of, for example, 470 nm by flowing a forward current to a pn junction.

As shown in FIG. 9(b), an undoped InGaAlP layer 1 is formed on, for example, a GaAs substrate 5 by a metal organic chemical vapor deposition (MOCVD) process. Thus, a wafer 2 shown in FIG. 9(b) is formed. As the GaAs substrate 5, a substrate having, at its (100) plane, a plane orientation that is about 10° off in the (011) direction is used. Furthermore, the InGaAlP layer 1 has a composition lattice-matched to the GaAs substrate 5, and in this method, the InGaAlP layer 1 is formed by an $In_{0.49}Ga_{0.51}P$ layer having a thickness of about 1 μm. In this way, since the InGaAlP layer 1 can realize a low defect density, the InGaAlP layer 1 can be expected to emit light at a high luminous efficiency.

As shown in FIG. 9(c), the wafer 1 and the wafer 2 are pasted together such that the ITO transparent electrode 21 of the wafer 1 and the InGaAlP layer 1 of the wafer 2 are bonded together. In this process step, a method for pasting the ITO transparent electrode 21 and the InGaAlP layer 1 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

As shown in FIG. 9(d), the GaAs substrate 5 is immersed in a mixed solution of, for example, $H_2SO_4$ and $H_2O_2$, thereby removing the GaAs substrate 5 by wet etching. Thus, a structure in which the InGaAlP layer 1 is bonded onto the wafer 1 having the blue-light-emitting diode structure is obtained.

Thereafter, as shown in FIG. 9(e), reactive ion etching (RIE) and photolithography techniques, for example, are repeatedly employed to shape the InGaAlP layer 1, the ITO transparent electrode 21, the p-type InGaAlN layer 19 and the active layer 18 into respective forms.

Next, as shown in FIG. 9(f), a Ti/Au electrode 20 is formed on the n-type InGaAlN layer 17 by electron-beam evaporation. In this process step, other than Ti/Au, as a material for the electrode 20, Al, Ag, Rh, Pt, or an alloy or multilayer metal film including any of these metals may be used, thus making it possible to realize the electrode exhibiting a high-reflection characteristic. Furthermore, on the ITO transparent electrode 21, an Au electrode 22 is formed by electron-beam evaporation.

Then, after the sapphire substrate 16 has been polished such that the thickness of the wafer having the structure shown in FIG. 9(f) becomes about 150 μm, for example, the wafer is diced into a size of 300 μm×300 μm. Thereafter, as shown in FIG. 9(g), the diced wafer is bonded to a package surface 23 using an Ag paste. Then, a YAG phosphor 3 is applied so as to cover the surface of the wafer. Thus, the white-light-emitting diode structure shown in FIG. 8 can be realized.

As described above, in the method for fabricating the semiconductor light emitting device according to the fourth embodiment of the present invention, the InGaAlP layer 1 and the YAG phosphor 3 are excited using the blue-light-emitting diode, and thus the emission in a red light emission region is stronger compared with a conventional white-light-emitting diode that emits white light by exciting a YAG phosphor using a blue-light-emitting diode. Accordingly, it is possible to realize the white-light-emitting diode structure that emits white light with excellent color rendering properties.

It should be noted that in the present embodiment, the Ti/Au electrode 20 and the Au electrode 22 are subjected to wire bonding although not shown.

Also, in the present embodiment, the ITO transparent electrode 21 does not necessarily have to be provided. However, in that case, it is necessary to reduce the resistivity of the p-type InGaAlN layer 19, and/or to laterally enlarge the range in which electric current flows by providing a micropattern, for example.

Further, in the present embodiment, a thick metal may be used instead of the sapphire substrate 16. In that case, it is not necessary to form the electrode 20 on the n-type InGaAlN layer 17.

Furthermore, in the present embodiment, an ultraviolet-light-emitting diode structure may be provided instead of the blue-light-emitting diode structure, and if excitation caused by ultraviolet light emission is utilized, a phosphor material in which a blue phosphor and a green phosphor are mixed may be used instead of the YAG phosphor 3. As a material for the green phosphor in that case, $Zn_2SiO_4$ to which Mn is added, $BaAl_{12}O_{19}$ to which Mn is added, $CeMgAl_{11}$ to which Tb is added, $BaMgAl_{10}O_{17}$ to which $Eu^{2+}$ and $Mn^{2+}$ are added, or $Y_2SiO_5$ to which $Ce^{3+}$ and $Tb^{3+}$ are added may be used as in the above-mentioned second embodiment. On the other hand, as a material for the blue phosphor, $BaMgAl_{14}O_{23}$ to which Eu is added, $YP_{0.85}V_{0.15}O_4$, $BaMg_2Al_{14}$ to which Eu is added, $(Sr, Ca)_{10}(PO_4)_6Cl_2$ to which $Eu^{2+}$ is added, or $BaMgAl_{10}O_{17}$ to which $Eu^{2+}$ is added may be used as in the above-mentioned second embodiment.

Fifth Embodiment

Hereinafter, a semiconductor light emitting device according to a fifth embodiment of the present invention will be described with reference to above-mentioned FIG. 5, FIG. 10, and FIGS. 11(a) through 11(f).

First, the structure of the semiconductor light emitting device according to the fifth embodiment of the present invention will be described with reference to FIG. 10.

Figure 10:
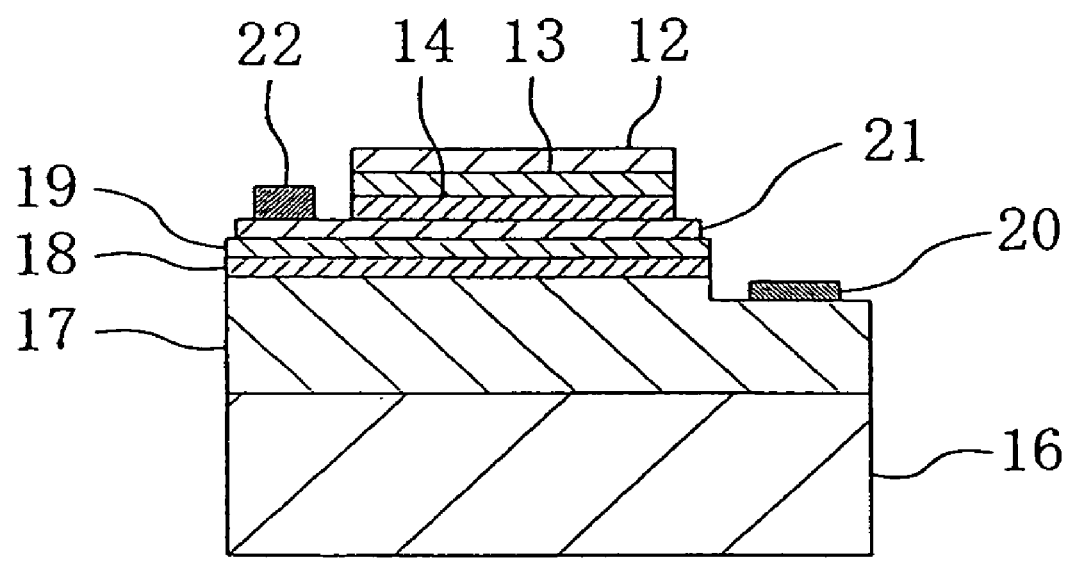
FIG. 10 is a structural cross-sectional view illustrating a semiconductor light emitting device according to a fifth embodiment of the present invention.

FIG. 10 is a cross-sectional view illustrating the structure of the semiconductor light emitting device according to the fifth embodiment of the present invention, and FIG. 10 specifically illustrates a white-light-emitting diode structure formed by combining first and second phosphor layers made of InGaAlP, a ZnMgSSe layer, and an ultraviolet-light-emitting diode.

As shown in FIG. 10, an n-type InGaAlN layer 17, an active layer 18 made of InGaAlN, and a p-type InGaAlN layer 19 are formed in this order from below over a sapphire substrate 16. Further, an electrode 20 made of Ti/Au is formed on the n-type InGaAlN layer 17, and an ITO transparent electrode 21 is formed on the p-type InGaAlN layer 19. In this embodiment, other than Ti/Au, as a material for the electrode 20, Al, Ag, Rh, Pt, or an alloy or multilayer metal film including any of these metals may be used, thus making it possible to realize the high-reflection electrode. On the ITO transparent electrode 21, an electrode 22 made of Au is selectively formed. Further, a ZnMgSSe layer 14, an undoped second InGaAlP layer 13, and an undoped first InGaAlP layer 12 are formed in this order over the ITO transparent electrode 21.

As described above, the semiconductor light emitting device shown in FIG. 10 has the structure functioning as a white-light-emitting diode formed by combining the first InGaAlP layer 12, the second InGaAlP layer 13, the ZnMgSSe layer 14 and the ultraviolet-light-emitting diode. Specifically, the semiconductor light emitting device shown in FIG. 10 has the structure in which the first InGaAlP layer 12 that emits red light due to excitation by the ultraviolet-light-emitting diode, the second InGaAlP layer 13 that emits green light due to excitation by the ultraviolet-light-emitting diode, and the ZnMgSSe layer 14 that emits blue light due to excitation by the ultraviolet-light-emitting diode are formed over the ultraviolet-light-emitting diode having the InGaAlN active layer 18, with the ITO transparent electrode 21 sandwiched between the ultraviolet-light-emitting diode and the first and second InGaAlP layers 12 and 13 and ZnMgSSe layer 14. Therefore, the semiconductor light emitting device functions as a white-light-emitting diode.

In this embodiment, the first InGaAlP layer 12 is formed by, for example, an $In_{0.48}Ga_{0.52}P$ layer, has a band gap of 1.9 eV, and emits red light having a wavelength of 650 nm. Further, the second InGaAlP layer 13 is formed by, for example, an $In_{0.48}Ga_{0.08}Al_{0.04}P$ layer, has a band gap of 2.3 eV, and emits green light having a wavelength of 550 nm. Furthermore, the ZnMgSSe layer 14 is formed by, for example, a $Zn_{0.95}Mg_{0.05}S_{0.06}Se_{0.94}$ layer, has a band gap of 2.6 eV, and emits blue light having a wavelength of 470 nm.

Besides, if the first InGaAlP layer 12, second InGaAlP layer 13 and ZnMgSSe layer 14 are formed by the $In_{0.48}Ga_{0.52}P$ layer, $In_{0.48}Ga_{0.08}Al_{0.04}P$ layer and $Zn_{0.95}Mg_{0.05}S_{0.06}Se_{0.94}$ layer, respectively, the first InGaAlP layer 12, second InGaAlP layer 13 and ZnMgSSe layer 14 are lattice-matched to GaAs to enable crystal growth; therefore, as also described in the after-mentioned fabrication method, each of the layers can realize a low defect density, and thus each of the layers can be expected to emit light at a high luminous efficiency.

By irradiating the first InGaAlP layer 12, second InGaAlP layer 13 and ZnMgSSe layer 14 with excitation light having a wavelength of, for example, 340 nm from the high-power ultraviolet-light-emitting diode, the semiconductor light emitting device according to the fifth embodiment of the present invention can emit white light having the spectrum shown in FIG. 5 as in the second and third embodiments. As apparent from FIG. 5, the emission spectrum is formed by: transmitted ultraviolet light emission (having a wavelength of 340 nm) from the ultraviolet-light-emitting diode; red light emission (having a wavelength of 650 nm) from the first InGaAlP layer 12; green light emission (having a wavelength of 550 nm) from the second InGaAlP layer 13; and blue light emission (having a wavelength of 470 nm) from the ZnMgSSe layer 14. Therefore, the semiconductor light emitting device according to the fifth embodiment of the present invention functions as a white-light-emitting diode that emits white light.

As described above, in the semiconductor light emitting device according to the fifth embodiment of the present invention, the first InGaAlP layer 12, second InGaAlP layer 13 and ZnMgSSe layer 14 are excited using the ultraviolet-light-emitting diode, and thus the emission in a red light emission region is stronger and the output balance of three colors, i.e., blue, green and red, is better compared with a conventional white-light-emitting diode that emits white light by exciting a YAG phosphor using a blue-light-emitting diode. Accordingly, it is possible to realize the light emitting diode that emits white light with excellent color rendering properties.

Secondly, a method for fabricating the semiconductor light emitting device according to the fifth embodiment of the present invention shown in FIG. 10 will be described with reference to FIGS. 11(a) through 11(f).

Figure 11A:
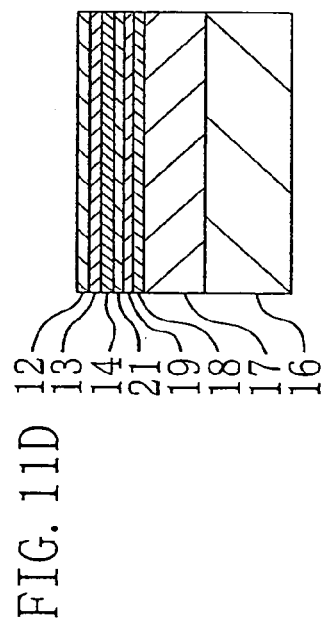
FIGS. 11(a) through 11(f) are cross-sectional views illustrating process steps of a method for fabricating the semiconductor light emitting device according to the fifth embodiment of the present invention.

As shown in FIG. 11(a), an n-type InGaAlN layer 17, an active layer 18 made of InGaAlN, and a p-type InGaAlN layer 19 are epitaxially grown in this order over a sapphire substrate 16 by a metal organic chemical vapor deposition (MOCVD) process. In this method, a GaN buffer layer or undoped GaN layer grown at about 500° C., for example, may be inserted between the sapphire substrate 16 and the n-type InGaAlN layer 17. Further, the active layer 18 may include a multiple quantum well structure formed by InGaN in which the composition of In is varied. Subsequently, in order to activate the p-type InGaAlN layer 19, annealing is performed at 700° C. for about one hour in an $N_2$ gas atmosphere, for example. Thereupon, an ITO transparent electrode 21 is formed to a thickness of about 300 nm on the p-type InGaAlN layer 19 by an RF sputtering process, for example. In order to reduce the resistance of the ITO transparent electrode 21, annealing may be performed in an $O_2$ atmosphere, for example. In that case, the annealing for activating the p-type InGaAlN layer 19 may be omitted, and only the annealing for reducing the resistance of the ITO transparent electrode 21 may be performed. Thus, a wafer 1 shown in FIG. 11(a) is formed. The wafer 1 has an ultraviolet-light-emitting diode structure, and emits ultraviolet light having a wavelength of, for example, 340 nm by flowing a forward current to a pn junction.

Figure 11B:
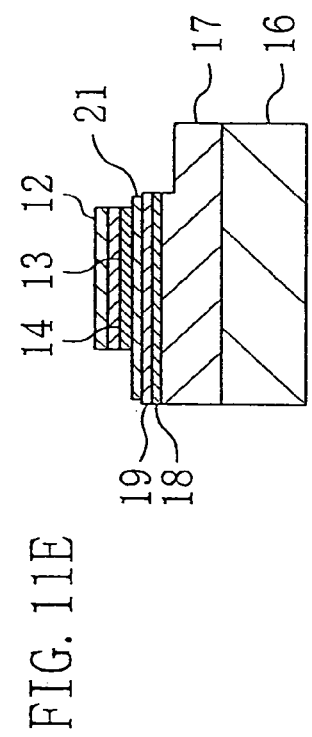

Next, as shown in FIG. 11(b), an undoped first InGaAlP layer 12, an undoped second InGaAlP layer 13 and a ZnMgSSe layer 14 are formed in this order over, for example, a GaAs substrate 5 by a metal organic chemical vapor deposition (MOCVD) process. Thus, a wafer 2 shown in FIG. 11(b) is formed. As the GaAs substrate 5, a substrate having, at its (100) plane, a plane orientation that is about 10° off in the (011) direction is used. Furthermore, the first InGaAlP layer 12, second InGaAlP layer 13 and ZnMgSSe layer 14 each have a composition lattice-matched to the GaAs substrate 5; in addition, the first InGaAlP layer 12 is formed by an $In_{0.48}Ga_{0.52}P$ layer having a thickness of about 1 μm, the second InGaAlP layer 13 is formed by an $In_{0.48}Ga_{0.08}Al_{0.04}P$ layer having a thickness of about 1 μm, and the ZnMgSSe layer 14 is formed by a $Zn_{0.95}Mg_{0.05}S_{0.06}Se_{0.94}$ layer having a thickness of about 1 μm. In this way, since the first InGaAlP layer 12, second InGaAlP layer 13 and ZnMgSSe layer 14 can each realize a low defect density, each of the layers can be expected to emit light at a high luminous efficiency.

Figure 11D:
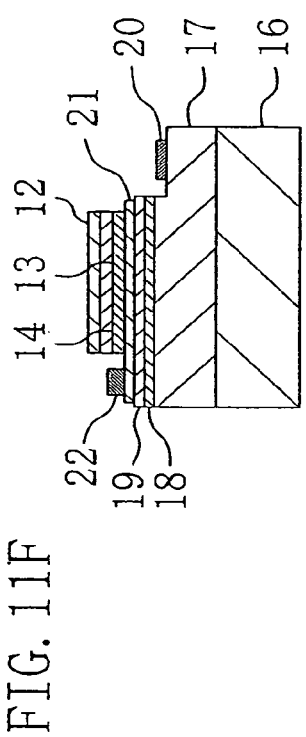
Figure 11C:
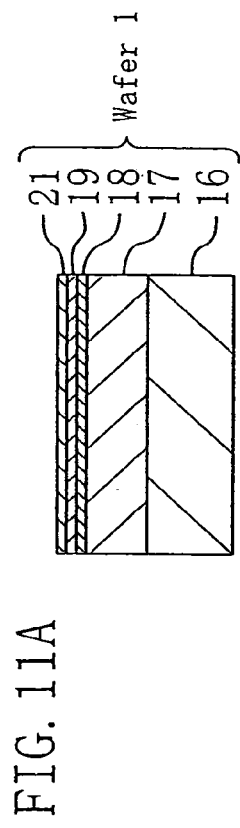

Then, as shown in FIG. 11(c), the wafer 1 and the wafer 2 are pasted together such that the ITO transparent electrode 21 of the wafer 1 and the ZnMgSSe layer 14 of the wafer 2 are bonded together. In this process step, a method for pasting the ITO transparent electrode 21 and the ZnMgSSe layer 14 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

Subsequently, as shown in FIG. 11(d), the GaAs substrate 5 is immersed in a mixed solution of, for example, $H_2SO_4$ and $H_2O_2$, thereby removing the GaAs substrate 5 by wet etching. Thus, a structure in which the ZnMgSSe layer 14 is bonded onto the wafer 1 having the ultraviolet-light-emitting diode structure is obtained.

Figure 11E:
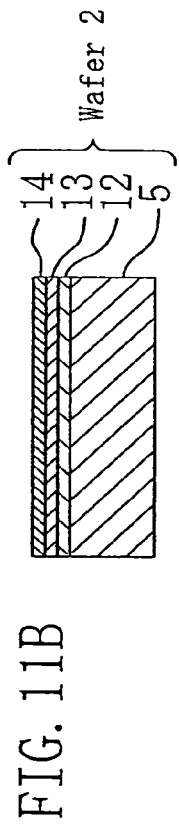

Thereafter, as shown in FIG. 11(e), reactive ion etching (RIE) and photolithography techniques, for example, are repeatedly employed to shape the first InGaAlP layer 12, second InGaAlP layer 13, ITO transparent electrode 21, p-type InGaAlN layer 19 and active layer 18 into respective forms.

Figure 11F:
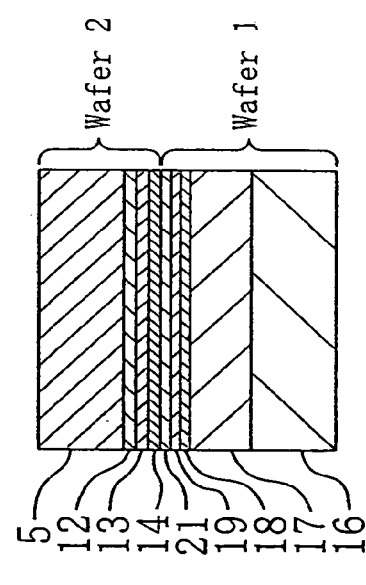

Next, as shown in FIG. 11(f), a Ti/Au electrode 20 is formed on the n-type InGaAlN layer 17 by electron-beam evaporation. Furthermore, on the ITO transparent electrode 21, an Au electrode 22 is formed by electron-beam evaporation. In this process step, other than Ti/Au, as a material for the electrode 20, Al, Ag, Rh, Pt, or an alloy or multilayer metal film including any of these metals may be used, thus making it possible to realize the electrode exhibiting a high-reflection characteristic. Subsequently, after the sapphire substrate 16 has been polished such that the thickness of the wafer having the structure shown in FIG. 11(f) becomes about 150 μm, for example, the wafer is diced into a size of 300 μm×300 μm. Thus, the white-light-emitting diode structure shown in FIG. 10 can be realized.

As described above, in the method for fabricating the semiconductor light emitting device according to the fifth embodiment of the present invention, the first InGaAlP layer 12, second InGaAlP layer 13 and ZnMgSSe layer 14 are excited using the ultraviolet-light-emitting diode, and thus the emission in a red light emission region is stronger compared with a conventional white-light-emitting diode that emits white light by exciting a YAG phosphor using a blue-light-emitting diode. Accordingly, it is possible to realize the white-light-emitting diode structure that emits white light with excellent color rendering properties.

It should be noted that in the present embodiment, the Ti/Au electrode 20 and the Au electrode 22 are subjected to wire bonding although not shown.

Also, in the present embodiment, the ITO transparent electrode 21 does not necessarily have to be provided. However, in that case, it is necessary to reduce the resistivity of the p-type InGaAlN layer 19, and/or to laterally enlarge the range in which electric current flows by providing a micropattern, for example.

Further, in the present embodiment, a thick metal may be used instead of the sapphire substrate 16. In that case, it is not necessary to form the Ti/Au electrode 20 on the n-type InGaAlN layer 17.

Furthermore, in the present embodiment, a blue-light-emitting diode structure may be provided instead of the ultraviolet-light-emitting diode structure, and if excitation caused by blue light emission is utilized, it is not necessary to form the ZnMgSSe layer 14.

Sixth Embodiment

Hereinafter, a semiconductor light emitting device according to a sixth embodiment of the present invention will be described with reference to above-mentioned FIG. 2, FIG. 12, and FIGS. 13(a) through 13(j).

First, the structure of the semiconductor light emitting device according to the sixth embodiment of the present invention will be described with reference to FIG. 12.

Figure 12:
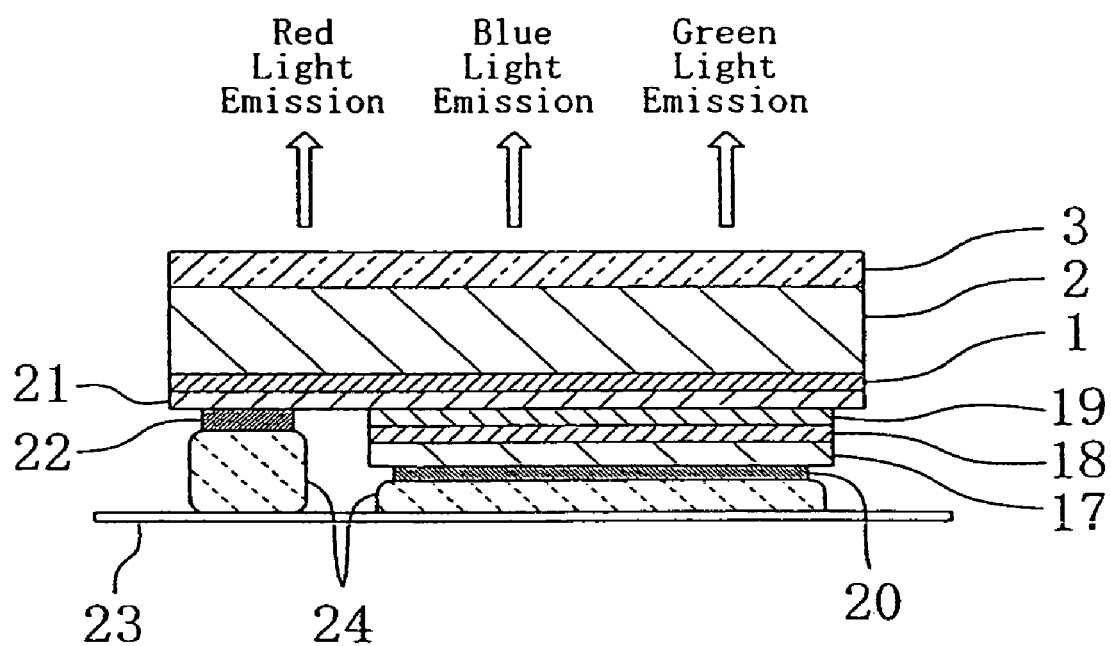
FIG. 12 is a structural cross-sectional view illustrating a semiconductor light emitting device according to a sixth embodiment of the present invention.

FIG. 12 illustrates a white-light-emitting diode structure formed by combining a YAG phosphor, an InGaAlP phosphor layer, and a blue-light-emitting diode.

As shown in FIG. 12, Ag bumps 24 are formed on a package surface 23, and a Ti/Au electrode 20, an n-type InGaAlN layer 17, an active layer 18 formed of an InGaAlN layer, and a p-type InGaAlN layer 19 are formed in this order over one of the Ag bumps 24. In this embodiment, other than Ti/Au, as a material for the electrode 20, Al, Ag, Rh, Pt, or an alloy or multilayer metal film including any of these metals may be used, thus making it possible to realize the high-reflection electrode. Further, an Au electrode 22 is formed on the other Ag bump 24. On the p-type InGaAlN layer 19 and the Au electrode 22, an ITO transparent electrode 21 is formed. Over the ITO transparent electrode 21, an InGaAlP layer 1, a quartz substrate 2 and a YAG phosphor 3 are formed.

Thus, the semiconductor light emitting device shown in FIG. 12 has a structure in which the semiconductor layers, having a blue-light-emitting diode structure with the active layer 18, are brought into intimate contact with the quartz substrate 2, having the InGaAlP layer 1 and YAG phosphor 3, so that the ITO transparent electrode is sandwiched between the semiconductor layers and the InGaAlP layer 1, quartz substrate 2 and YAG phosphor 3.

In this embodiment, the InGaAlP layer 1 is formed by, for example, an $In_{0.49}Ga_{0.51}P$ layer, has a band gap of 1.9 eV, and emits red light having a wavelength of 650 nm. Moreover, if the InGaAlP layer 1 is formed by the $In_{0.49}Ga_{0.51}P$ layer, the InGaAlP layer 1 is lattice-matched to GaAs to enable crystal growth; therefore, as also described in the after-mentioned fabrication method, the InGaAlP layer 1 can realize a low defect density, and thus the InGaAlP layer 1 can be expected to emit light at a high luminous efficiency.

By irradiating the InGaAlP layer 1 and YAG phosphor 3 with excitation light having a wavelength of, for example, 470 nm from the high-power blue-light-emitting diode having the active layer 18, white light having the spectrum shown in FIG. 2 can be emitted. As apparent from FIG. 2, the emission spectrum is formed by: transmitted blue light emission (having a wavelength of 470 nm) from the blue-light-emitting diode having the active layer 18; yellow light emission (having a peak wavelength of 550 nm) from the YAG phosphor 3; and red light emission (having a wavelength of 650 nm) from the InGaAlP layer 1. Therefore, the semiconductor light emitting device shown in FIG. 12 functions as a white-light-emitting diode that emits white light.

It should be noted that although the case where the n-type InGaAlN layer 17, the active layer 18 and the p-type InGaAlN layer 19 are formed in this order from below over the associated Ag bump 24 has been described, the p-type InGaAlN layer 19, the active layer 18 and the n-type InGaAlN layer 17 may alternatively be formed in this order over the associated Ag bump 24. Optionally, there may be the case where the ITO transparent electrode 21 is not formed over the Ag bumps 24.

As described above, in the semiconductor light emitting device according to the sixth embodiment of the present invention, the InGaAlP layer 1 and the YAG phosphor 3 are excited using the blue-light-emitting diode, and thus the emission in a red light emission region is stronger compared with a conventional white-light-emitting diode that emits white light by exciting a YAG phosphor using a blue-light-emitting diode. Accordingly, it is possible to realize the light emitting diode that emits white light with excellent color rendering properties.

Secondly, a method for fabricating the semiconductor light emitting device according to the sixth embodiment of the present invention will be described with reference to FIGS. 13(a) through 13(j).

Figure 13:
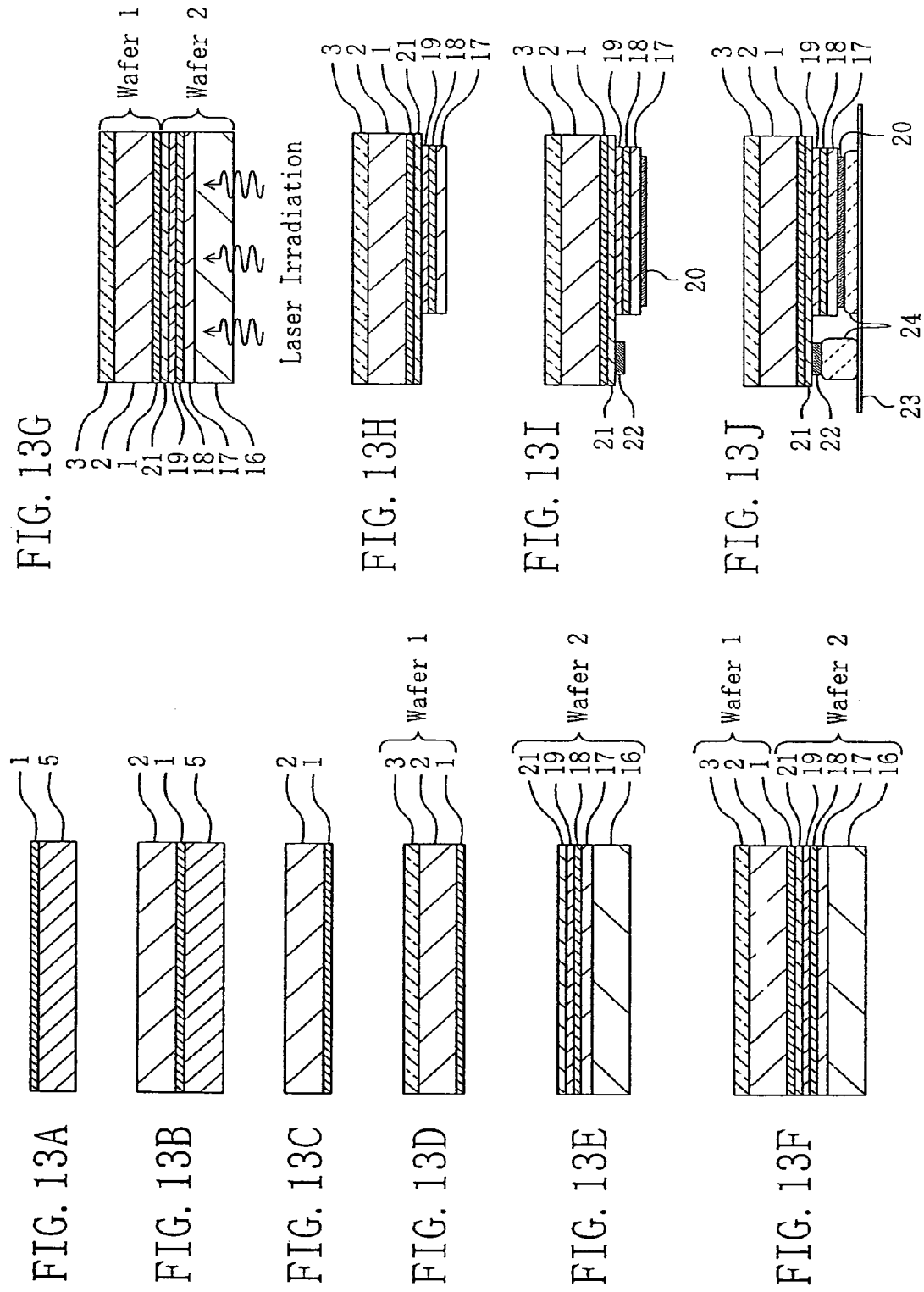
FIGS. 13(a) through 13(j) are cross-sectional views illustrating process steps of a method for fabricating the semiconductor light emitting device according to the sixth embodiment of the present invention.

First, as shown in FIG. 13(a), an undoped InGaAlP layer 1 is formed on, for example, a GaAs substrate 5 by a metal organic chemical vapor deposition (MOCVD) process. As the GaAs substrate 5, a substrate having, at its (100) plane, a plane orientation that is about 10° off in the (011) direction is used. Furthermore, the InGaAlP layer 1 has a composition lattice-matched to the GaAs substrate 5, and in this method, the InGaAlP layer 1 is formed by an $In_{0.49}Ga_{0.51}P$ layer having a thickness of about 1 μm. In this way, since the InGaAlP layer 1 can realize a low defect density, the InGaAlP layer 1 can be expected to emit light at a high luminous efficiency.

Next, as shown in FIG. 13(b), a quartz substrate 2 and the GaAs substrate 5 having the InGaAlP layer 1 are pasted together such that the quartz substrate 2 is bonded onto the InGaAlP layer 1. In this process step, a method for pasting the quartz substrate 2 and the InGaAlP layer 1 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

Then, as shown in FIG. 13(c), the GaAs substrate 5 is immersed in a mixed solution of, for example, $H_2SO_4$ and $H_2O_2$, thereby removing the GaAs substrate 5 by wet etching. Thus, a structure in which the InGaAlP layer 1 is bonded to the quartz substrate 2 is obtained.

Thereafter, as shown in FIG. 13(d), a YAG phosphor 3 is applied onto a surface of the quartz substrate 2 at the side where the InGaAlP layer 1 is not formed. In this process step, the quartz substrate 2 may be polished and formed into a film before the application of the YAG phosphor 3 such that the thickness of the quartz substrate 2 becomes 100 μm or less, for example. Thus, a wafer 1 shown in FIG. 13(d) is formed.

Next, as shown in FIG. 13(e), an n-type InGaAlN layer 17, an active layer 18 made of InGaAlN, and a p-type InGaAlN layer 19 are epitaxially grown in this order over a sapphire substrate 16 by a metal organic chemical vapor deposition (MOCVD) process. In this method, a GaN buffer layer or undoped GaN layer grown at about 500° C., for example, may be inserted between the sapphire substrate 16 and the n-type InGaAlN layer 17. Further, the active layer 18 may include a multiple quantum well structure formed by InGaN in which the composition of In is varied. Subsequently, in order to activate the p-type InGaAlN layer 19, annealing is performed at 700° C. for about one hour in an $N_2$ gas atmosphere, for example. Thereupon, an ITO transparent electrode 21 is formed to a thickness of about 300 nm on the p-type InGaAlN layer 19 by an RF sputtering process, for example. In order to reduce the resistance of the ITO transparent electrode 21, annealing may be performed in an $O_2$ atmosphere, for example. In that case, the annealing for activating the p-type InGaAlN layer 19 may be omitted, and only the annealing for reducing the resistance of the ITO transparent electrode 21 may be performed. Thus, a wafer 2 shown in FIG. 13(e) is formed. The wafer 2 has a blue-light-emitting diode structure, and emits blue light having a wavelength of, for example, 470 nm by flowing a forward current to a pn junction.

As shown in FIG. 13(f), the wafer 1 and the wafer 2 are pasted together such that the InGaAlP layer 1 of the wafer 1 and the ITO transparent electrode 21 of the wafer 2 are bonded together. In this process step, a method for pasting the ITO transparent electrode 21 and the InGaAlP layer 1 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

As shown in FIG. 13(g), from the side of the wafer 2 at which the sapphire substrate 16 is formed, KrF excimer laser (having a wavelength of 248 nm) is irradiated such that the wafer 2 is scanned within its surface. The irradiated laser is not absorbed by the sapphire substrate 16 but absorbed only by GaN. Accordingly, in the vicinity of an interface between the sapphire substrate 16 and the n-type InGaAlN layer 17, localized heat generation occurs to break the bonding of GaN, and therefore, the sapphire substrate 16 is separated from the n-type InGaAlN layer 17. Thus, there is achieved a device structure in which the GaN-based semiconductor layers (i.e., the n-type InGaAlN layer 17, the active layer 18 made of InGaAlN, and the p-type InGaAlN layer 19) are bonded to the quartz substrate 2 via the ITO transparent electrode 21 and the InGaAlP layer 1.

Furthermore, as the light used to separate the sapphire substrate 16, KrF excimer laser (having a wavelength of 248 nm) is utilized in this method; however, a third harmonic of YAG laser (having a wavelength of 355 nm) may alternatively be used. Optionally, an emission line of a mercury lamp (having a wavelength of 365 nm) may be used. In that case, even though optical power is inferior to that of the laser, a spot size can be increased, and therefore, the separation is enabled in a short period of time. Besides, as a method for separating the sapphire substrate 16, it may be removed by polishing. In such a case, the separation is enabled at a large area and at a low cost.

Thereafter, as shown in FIG. 13(h), reactive ion etching (RIE) and photolithography techniques, for example, are employed to shape the n-type InGaAlN layer 17, the active layer 18 and the p-type InGaAlN layer 19 into respective forms.

Next, as shown in FIG. 13(i), a Ti/Au electrode 20 is formed by electron-beam evaporation on a surface of the n-type InGaAlN layer 17 at the side where the active layer 18 is not formed. In this process step, other than Ti/Au, as a material for the electrode 20, Al, Ag, Rh, Pt, or an alloy or multilayer metal film including any of these metals may be used, thus making it possible to realize the electrode exhibiting a high-reflection characteristic. Furthermore, an Au electrode 22 is formed by electron-beam evaporation on a surface of the ITO transparent electrode 21 at the side where the InGaAlP layer 1 is not formed.

Subsequently, as shown in FIG. 13(j), Ag bumps 24 are formed on a surface of the Ti/Au electrode 20 at the side where the n-type InGaAlN layer 17 is not formed, and on a surface of the Au electrode 22 at the side where the ITO transparent electrode 21 is not formed. Then, the wafer having such a structure is diced into a size of 300 µm×300 µm, and is flip-chip mounted on a package surface 23. Thus, the white-light-emitting diode structure shown in FIG. 12 can be realized.

As described above, in the method for fabricating the semiconductor light emitting device according to the sixth embodiment of the present invention, the InGaAlP layer 1 and the YAG phosphor 3 are excited using the blue-light-emitting diode, and thus the emission in a red light emission region is stronger compared with a conventional white-light-emitting diode that emits white light by exciting a YAG phosphor using a blue-light-emitting diode. Accordingly, it is possible to realize the white-light-emitting diode structure that emits white light with excellent color rendering properties.

It should be noted that in the present embodiment, a sapphire substrate may be used instead of the quartz substrate 2.

Moreover, in the present embodiment, the p-type layer and the n-type layer may be located upside down.

Further, in the present embodiment, although the structure in which the InGaAlP layer 1 of the wafer 1 is pasted on the ITO electrode 21 of the wafer 2 has been described, another structure in which the InGaAlP layer 1 is pasted on the sapphire substrate 16 of the wafer 2 and the YAG phosphor 3 is applied may alternatively be provided. In that case, it is not necessary to form the ITO transparent electrode 21.

Seventh Embodiment

Hereinafter, a semiconductor light emitting device according to a seventh embodiment of the present invention will be described with reference to above-mentioned FIG. 5, FIG. 14, and FIGS. 15(a) through 15(i).

First, the structure of the semiconductor light emitting device according to the seventh embodiment of the present invention will be described with reference to FIG. 14.

Figure 14:
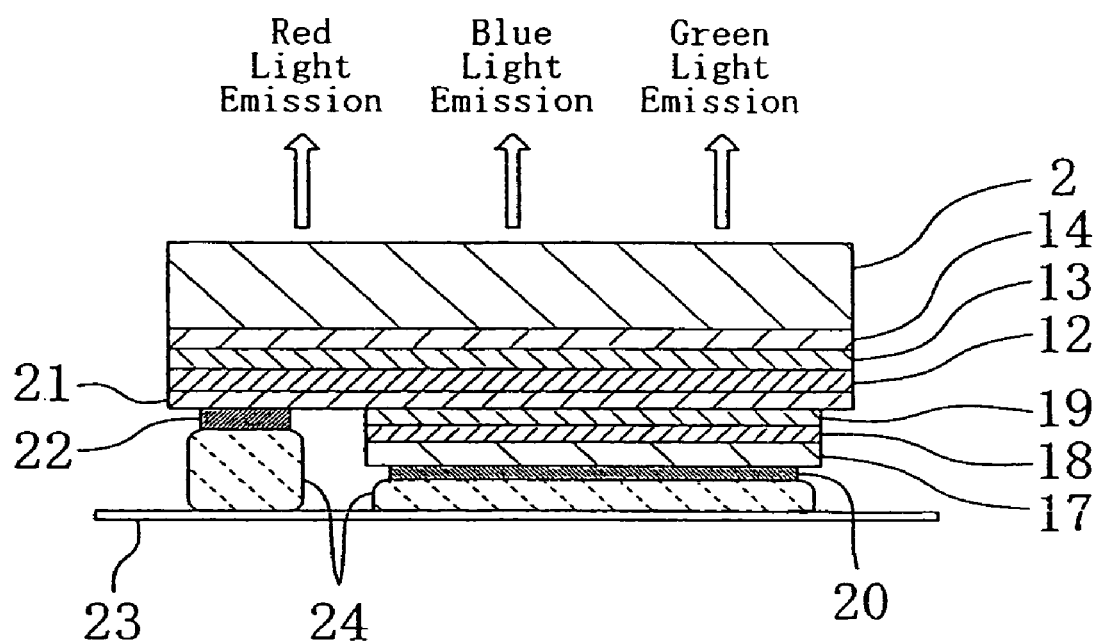
FIG. 14 is a structural cross-sectional view illustrating a semiconductor light emitting device according to a seventh embodiment of the present invention.
Figure 16:
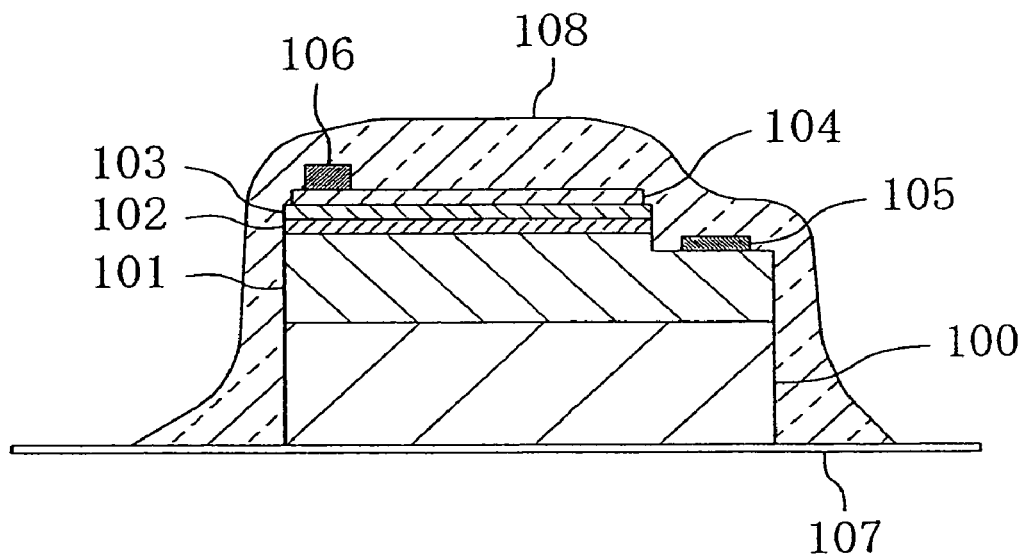
FIG. 16 is a structural cross-sectional view illustrating a semiconductor light emitting device according to a conventional example.
Figure 17:
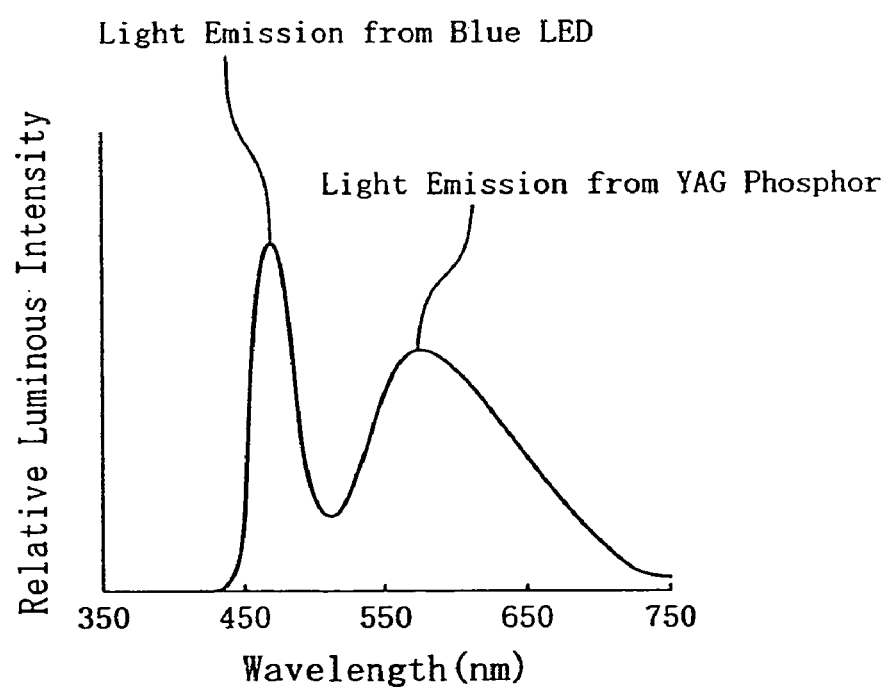
FIG. 17 is a graph illustrating emission spectrum of the semiconductor light emitting device according to the conventional example.

FIG. 14 illustrates a white-light-emitting diode structure in which a first InGaAlP layer 12, a second InGaAlP layer 13, a ZnMgSSe layer 14 and an ultraviolet-light-emitting diode are combined.

As shown in FIG. 14, Ag bumps 24 are formed on a package surface 23, and a Ti/Au electrode 20, an n-type InGaAlN layer 17, an active layer 18 formed of an InGaAlN layer, and a p-type InGaAlN layer 19 are formed in this order over one of the Ag bumps 24. In this embodiment, other than Ti/Au, as a material for the electrode 20, Al, Ag, Rh, Pt, or an alloy or multilayer metal film including any of these metals may be used, thus making it possible to realize the electrode 20 exhibiting a high-reflection characteristic. Furthermore, an Au electrode 22 is formed on the other Ag bump 24. On the p-type InGaAlN layer 19 and the Au electrode 22, an ITO transparent electrode 21 is formed. Over the ITO transparent electrode 21, a first InGaAlP layer 12, a second InGaAlP layer 13, a ZnMgSSe layer 14, and a quartz substrate 2 are formed in this order.

Thus, the semiconductor light emitting device shown in FIG. 14 has a structure in which the semiconductor layers, having an ultraviolet-light-emitting diode structure with the active layer 18, are brought into intimate contact with the quartz substrate 2, having the first InGaAlP layer 12, second InGaAlP layer 13 and ZnMgSSe layer 14, such that the ITO transparent electrode 21 is sandwiched between the semiconductor layers and the first InGaAlP layer 12, second InGaAlP layer 13 and ZnMgSSe layer 14.

In this embodiment, the first InGaAlP layer 12 is formed by, for example, an $In_{0.48}Ga_{0.52}P$ layer, has a band gap of 1.9 eV, and emits red light having a wavelength of 650 nm. Further, the second InGaAlP layer 13 is formed by, for example, an $In_{0.48}Ga_{0.08}Al_{0.04}P$ layer, has a band gap of 2.3 eV, and emits green light having a wavelength of 550 nm. Furthermore, the ZnMgSSe layer 14 is formed by, for example, a $Zn_{0.95}Mg_{0.05}S_{0.06}Se_{0.94}$ layer, has a band gap of 2.6 eV, and emits blue light having a wavelength of 470 nm.

Besides, if the first InGaAlP layer 12, second InGaAlP layer 13 and ZnMgSSe layer 14 are formed by the $In_{0.48}Ga_{0.52}P$ layer, $In_{0.48}Ga_{0.08}Al_{0.04}P$ layer and $Zn_{0.95}Mg_{0.05}S_{0.06}Se_{0.94}$ layer, respectively, the first InGaAlP layer 12, second InGaAlP layer 13 and ZnMgSSe layer 14 are lattice-matched to GaAs to enable crystal growth; therefore, as also described in the after-mentioned fabrication method, each of the layers can realize a low defect density, and thus each of the layers can be expected to emit light at a high luminous efficiency.

By irradiating the first InGaAlP layer 12, second InGaAlP layer 13 and ZnMgSSe layer 14 with excitation light having a wavelength of, for example, 340 nm from the high-power ultraviolet-light-emitting diode having the active layer 18, the semiconductor light emitting device shown in FIG. 14 can emit white light having the spectrum shown in FIG. 5 as in the second embodiment. As apparent from FIG. 5, the emission spectrum is formed by: transmitted ultraviolet light emission (having a wavelength of 340 nm) from the ultraviolet-light-emitting diode 11; red light emission (having a wavelength of 650 mm) from the first InGaAlP layer 12; green light emission (having a wavelength of 550 nm) from the second InGaAlP layer 13; and blue light emission (having a wavelength of 470 nm) from the ZnMgSSe layer 14. Therefore, the semiconductor light emitting device shown in FIG. 14 functions as a white-light-emitting diode that emits white light.

It should be noted that although the case where the n-type InGaAlN layer 17, the active layer 18 and the p-type InGaAlN layer 19 are formed in this order from below over the associated Ag bump 24 has been described, the p-type InGaAlN layer 19, the active layer 18 and the n-type InGaAlN layer 17 may alternatively be formed in this order over the associated Ag bump 24. Optionally, there may be the case where the ITO transparent electrode 21 is not formed over the Ag bumps 24.

As described above, in the semiconductor light emitting device according to the seventh embodiment of the present invention, the first InGaAlP layer 12, second InGaAlP layer 13 and ZnMgSSe layer 14 are excited using the ultravioletlight-emitting diode, and thus the emission in a red light emission region is stronger and the output balance of three colors, i.e., blue, green and red, is better compared with a conventional white-light-emitting diode that emits white light by exciting a YAG phosphor using a blue-light-emitting diode. Accordingly, it is possible to realize the white-light-emitting diode structure that emits white light with excellent color rendering properties.

Secondly, a method for fabricating the semiconductor light emitting device according to the seventh embodiment of the present invention will be described with reference to FIGS. 15(a) through 15(i).

First, as shown in FIG. 15(a), an undoped first InGaAlP layer 12 and an undoped second InGaAlP layer 13 are formed in this order over, for example, a GaAs substrate 5 by a metal organic chemical vapor deposition (MOCVD) process. Further, a ZnMgSSe layer 14 is formed on the second InGaAlP layer 13.

In this method, as the GaAs substrate 5, a substrate having, at its (100) plane, a plane orientation that is about 10° off in the (011) direction is used. Furthermore, the first InGaAlP layer 12, second InGaAlP layer 13 and ZnMgSSe layer 14 each have a composition lattice-matched to the GaAs substrate 5; in addition, the first InGaAlP layer 12 is formed by an $In_{0.48}Ga_{0.52}P$ layer having a thickness of about 1 μm, the second InGaAlP layer 13 is formed by an $In_{0.48}Ga_{0.08}Al_{0.04}P$ layer having a thickness of about 1 μm, and the ZnMgSSe layer 14 is formed by a $Zn_{0.95}Mg_{0.05}S_{0.06}Se_{0.94}$ layer having a thickness of about 1 μm. In this way, since the first InGaAlP layer 12, second InGaAlP layer 13 and ZnMgSSe layer 14 can each realize a low defect density, each of the layers can be expected to emit light at a high luminous efficiency.

Besides, the first InGaAlP layer 12 emits red light due to excitation by ultraviolet light, the second InGaAlP layer 13 emits green light due to excitation by ultraviolet light, and the ZnMgSSe layer 14 emits blue light due to excitation by ultraviolet light.

Next, as shown in FIG. 15(b), a quartz substrate 2 and the GaAs substrate 5, having the first InGaAlP layer 12, second InGaAlP layer 13 and ZnMgSSe layer 14, are pasted together such that the quartz substrate 2 is bonded onto the ZnMgSSe layer 14. In this process step, a method for pasting the quartz substrate 2 and the ZnMgSSe layer 14 together may be a method for bonding them together in an aqueous solution, or may be a method for bonding them together by applying heat or pressure thereto. An adhesive such as epoxy, for example, may be used to paste them together.

Subsequently, as shown in FIG. 15(c), the GaAs substrate 5 is immersed in a mixed solution of, for example, $H_2SO_4$ and $H_2O_2$, thereby removing the GaAs substrate 5 by wet etching. Thus, a structure in which the first InGaAlP layer 12, second InGaAlP layer 13 and ZnMgSSe layer 14 are bonded to the quartz substrate 2 is obtained. In this way, a wafer 1 shown in FIG. 15(c) is formed.

Thereafter, as shown in FIG. 15(d), an n-type InGaAlN layer 17, an active layer 18 made of InGaAlN, and a p-type InGaAlN layer 19 are epitaxially grown in this order over a sapphire substrate 16 by a metal organic chemical vapor deposition (MOCVD) process. In this method, a GaN buffer layer or undoped GaN layer grown at about 500° C., for example, may be inserted between the sapphire substrate 16 and the n-type InGaAlN layer 17. Further, the active layer 18 may include a multiple quantum well structure formed by InGaN in which the composition of In is varied. Subsequently, in order to activate the p-type InGaAlN layer 19, annealing is performed at 700° C. for about one hour in an $N_2$ gas atmosphere, for example. Thereupon, an ITO transparent electrode 21 is formed to a thickness of about 300 nm on the p-type InGaAlN layer 19 by an RF sputtering process, for example. In order to reduce the resistance of the ITO transparent electrode 21, annealing may be performed in an $O_2$ atmosphere, for example. In that case, the annealing for activating the p-type InGaAlN layer 19 may be omitted, and only the annealing for reducing the resistance of the ITO transparent electrode 21 may be performed. Thus, a wafer 2 shown in FIG. 15(d) is formed. The wafer 2 has an ultraviolet-light-emitting diode structure, and emits ultraviolet light having a wavelength of, for example, 340 nm by flowing a forward current to a pn junction.

As shown in FIG. 15(e), the wafer 1 and the wafer 2 are pasted together such that the first InGaAlP layer 12 of the wafer 1 and the ITO transparent electrode 21 of the wafer 2 are bonded together. In this process step, a method for pasting the first InGaAlP layer 12 and the ITO transparent electrode 21 together may be a method for bonding them together in an aqueous solution, or may be a method for bonding them together by applying heat or pressure thereto. An adhesive such as epoxy, for example, may be used to paste them together. Alternatively, glass frit, for example, may be used to bond them together.

As shown in FIG. 15(f), from the side of the wafer 2 at which the sapphire substrate 16 is formed, KrF excimer laser (having a wavelength of 248 nm) is irradiated such that the wafer 2 is scanned within its surface. The irradiated laser is not absorbed by the sapphire substrate 16 but absorbed only by GaN. Accordingly, in the vicinity of an interface between the sapphire substrate 16 and the n-type InGaAlN layer 17, localized heat generation occurs to break the bonding of GaN, and therefore, the sapphire substrate 16 is separated from the n-type InGaAlN layer 17. Thus, there is achieved a device structure in which the GaN-based semiconductor layers (i.e., the n-type InGaAlN layer 17, the active layer 18 made of InGaAlN, and the p-type InGaAlN layer 19) are bonded to the quartz substrate 2 via the ITO transparent electrode 21, first InGaAlP layer 12, second InGaAlP layer 13 and ZnMgSSe layer 14.

Furthermore, as the light used to separate the sapphire substrate 16, KrF excimer laser (having a wavelength of 248 nm) is utilized in this method; however, a third harmonic of YAG laser (having a wavelength of 355 mm) may alternatively be used. Optionally, an emission line of a mercury lamp (having a wavelength of 365 nm) may be used. In that case, even though optical power is inferior to that of the laser, a spot size can be increased, and therefore, the separation is enabled in a short period of time. Besides, as a method for separating the sapphire substrate 16, it may be removed by polishing. In such a case, the separation is enabled at a large area and at a low cost.

Thereafter, as shown in FIG. 15(g), reactive ion etching (RIE) and photolithography techniques, for example, are employed to shape the n-type InGaAlN layer 17, active layer 18 and p-type InGaAlN layer 19 into respective forms.

Next, as shown in FIG. 15(h), a Ti/Au electrode 20 is formed by electron-beam evaporation on a surface of the n-type InGaAlN layer 17 at the side where the active layer 18 is not formed. In this process step, other than Ti/Au, as a material for the electrode 20, Al, Ag, Rh, Pt, or an alloy or multilayer metal film including any of these metals may be used, thus making it possible to realize the electrode exhibiting a high-reflection characteristic. Furthermore, an Au electrode 22 is formed by electron-beam evaporation on a surface of the ITO transparent electrode 21 at the side where the first InGaAlP layer 12 is not formed.

Subsequently, as shown in FIG. 15(i), Ag bumps 24 are formed on a surface of the Ti/Au electrode 20 at the side where the n-type InGaAlN layer 17 is not formed, and on a surface of the Au electrode 22 at the side where the ITO transparent electrode 21 is not formed. Then, the wafer having such a structure is diced into a size of 300 μm×300 μm, and is flip-chip mounted on a package surface 23. Thus, the white-light-emitting diode structure shown in FIG. 14 can be realized.

As described above, in the method for fabricating the semiconductor light emitting device according to the seventh embodiment of the present invention, the first InGaAlP layer 12, second InGaAlP layer 13 and ZnMgSSe layer 14 are excited using the ultraviolet-light-emitting diode, and thus the emission in a red light emission region is stronger and the output balance of three colors, i.e., blue, green and red, is better compared with a conventional white-light-emitting diode that emits white light by exciting a YAG phosphor using a blue-light-emitting diode. Accordingly, it is possible to realize the white-light-emitting diode structure that emits white light with excellent color rendering properties.

It should be noted that in the present embodiment, a sapphire substrate may be used instead of the quartz substrate 2.

Moreover, in the present embodiment, the p-type layer and the n-type layer may be located upside down.

Further, in the present embodiment, although the case where the wafer 2 has an ultraviolet-light-emitting diode structure has been described, it is not necessary to form the ZnMgSSe layer 14 if the wafer 2 has a blue-light-emitting diode structure.

Furthermore, in the present embodiment, although the case where the wafer 2 has an ultraviolet-light-emitting diode structure has been described, a YAG phosphor may be further used if the wafer 2 has a blue-light-emitting diode structure.

Moreover, in the present embodiment, although the structure in which the first InGaAlP layer 12 of the wafer 1 is pasted on the ITO electrode 21 of the wafer 2 has been described, another structure in which the InGaAlP layer 12 of the wafer 1 is pasted on the sapphire substrate 16 of the wafer 2 may alternatively be provided. In that case, it is not necessary to form the ITO transparent electrode 21.

Besides, the substrate made of sapphire or GaAs used in any of the foregoing embodiments may have any plane orientation. For example, in the case of the substrate made of sapphire, the substrate may have a plane orientation with an off angle from a representative plane such as the (0001) plane. In addition, instead of the substrate made of GaAs, a substrate made of a semiconductor material such as Si, for example, which is removed easily, may be used.

Also, in each of the foregoing embodiments, the InGaAlN layer, the InGaAlP layer or the ZnMgSSe layer may have any composition, and may include a multilayer structure such as a quantum well structure. Further, the crystal growth of these layers is not limited to an MOCVD process, but the crystal growth of at least one or more of these layers may be carried out by an MBE process or a HVPE process, for example. Furthermore, each InGaAlN layer may include, as a constituting element, a Group V element such as As or P, or a Group III element such as B.

Furthermore, although the case where the InGaAlN layers are grown over the sapphire substrate has been described, a SiC substrate that allows transmission of most of visible light emission may be used. If the substrate is separated and removed after the growth, a semiconductor substrate made of Si or GaAs, for example, may alternatively be used; furthermore, a substrate made of MgO, $LiGaO_2$, $LiAlO_2$, or a mixed crystal of $LiGaO_2$ and $LiAlO_2$ may optionally be used. In addition, as for the crystal growth of the InGaAlN layers, the p-type InGaAlN layer, the InGaAlN active layer and the n-type InGaAlN layer may be formed in this order.

Note that as described above, the present invention is useful for phosphors having excellent color rendering properties, semiconductor devices on which the phosphors are integrated, and methods for fabricating the phosphors and the devices.

What is claimed is:

1. A phosphor apparatus that emits white light due to excitation by a light emitting diode chip capable of emitting blue or ultraviolet light, the phosphor apparatus comprising:
    a substrate that allows transmission of visible light; and
    a semiconductor layer formed on the substrate,
    wherein the light emitting diode chip is placed apart from the phosphor apparatus and the light emitting diode is not attached to the substrate; and
    wherein the semiconductor layer comprises at least a first semiconductor layer and a second semiconductor layer, wherein the first semiconductor layer emits red light due to excitation by the light emitting diode, and wherein the second semiconductor layer emits green light due to excitation by the light emitting diode.

2. The phosphor apparatus according to claim 1, wherein the first semiconductor layer is made of InGaAlP, and wherein the second semiconductor layer is made of ZnMgSSe.

3. The phosphor apparatus according to claim 1, wherein the substrate that allows transmission of visible light is a quartz substrate, a glass substrate or a sapphire substrate.

* * * * *